United States Patent
Ruiz et al.

(10) Patent No.: US 10,609,843 B2
(45) Date of Patent: Mar. 31, 2020

(54) MAGNETIC BLOCKING TILES FOR A DATACENTER FACILITY

(71) Applicant: Compass Datacenters, LLC, Dallas, TX (US)

(72) Inventors: Jose Alberto Ruiz, Frisco, TX (US); Christopher J. Crosby, Jr., Dallas, TX (US)

(73) Assignee: Compass Datacenters, LLC, Dallas, TX (US)

( * ) Notice: Subject to any disclaimer, the term of this patent is extended or adjusted under 35 U.S.C. 154(b) by 885 days.

(21) Appl. No.: 14/805,102

(22) Filed: Jul. 21, 2015

(65) Prior Publication Data

US 2015/0327408 A1 Nov. 12, 2015

Related U.S. Application Data

(63) Continuation-in-part of application No. 14/041,351, filed on Sep. 30, 2013, now Pat. No. 9,671,837.

(60) Provisional application No. 61/709,429, filed on Oct. 4, 2012.

(51) Int. Cl.
*H05K 7/20* (2006.01)

(52) U.S. Cl.
CPC ................ *H05K 7/20745* (2013.01)

(58) Field of Classification Search
CPC ...................................... H05K 7/20
USPC ........................................... 454/187
See application file for complete search history.

(56) References Cited

U.S. PATENT DOCUMENTS

| | | | | |
|---|---|---|---|---|
| 3,030,552 A * | 4/1962 | Gibbs | ............... | H01G 2/00 |
| | | | | 174/DIG. 12 |
| 3,208,580 A * | 9/1965 | Baruch | ............... | B65G 47/1421 |
| | | | | 198/757 |
| 3,307,332 A * | 3/1967 | Grace | ............... | B01D 39/1623 |
| | | | | 55/481 |

(Continued)

FOREIGN PATENT DOCUMENTS

GB         2467808 A      8/2010
WO    WO 2010/138771 A1  12/2010

OTHER PUBLICATIONS

"HP Performance Optimized Datacenter" downloaded Feb. 26, 2013 from http://en.wikipedia.org/wiski/HP_Performance_Optimized_Datacenter&oldid=536557730, 4 pages.

(Continued)

*Primary Examiner* — Grant Moubry
*Assistant Examiner* — Ryan L Faulkner
(74) *Attorney, Agent, or Firm* — Rutan & Tucker, LLP

(57) ABSTRACT

A distribution of the cooling air through one or more perforated tiles or other open areas in the raised floor of the data room is customized by placing one or more magnetic blocking tiles in a pattern to lie on top of the one or more of the perforated floor tiles or other open areas. The cooling air flow through the perforated floor tiles or other open areas to areas where the computing systems are not installed is cut off; and thus, the air flow is directed flow areas in the datacenter where the computing systems are designed to be located and actually are installed in the datacenter. The magnetic blocking tiles have a top surface that is solid and a bottom surface. The magnetic blocking tiles adhere magnetically to either the raised floor or the perforated tiles.

14 Claims, 14 Drawing Sheets

(56) References Cited

U.S. PATENT DOCUMENTS

| | | | |
|---|---|---|---|
| 3,684,922 A * | 8/1972 | Ericson | A43B 3/163 36/7.1 A |
| 3,924,370 A | 12/1975 | Cauceglia et al. | |
| 4,710,415 A * | 12/1987 | Slosberg | A47G 27/0231 428/48 |
| 4,804,392 A * | 2/1989 | Spengler | B01L 1/04 454/187 |
| 5,065,186 A * | 11/1991 | Valenti | H01F 27/38 315/371 |
| 5,386,332 A * | 1/1995 | Jagielinski | G11B 5/147 148/307 |
| 5,443,876 A * | 8/1995 | Koskenmaki | H01R 4/04 428/323 |
| 5,477,649 A | 12/1995 | Bessert | |
| 5,479,984 A * | 1/1996 | Easterbrook | F24F 13/08 165/96 |
| 5,507,883 A * | 4/1996 | Tanaka | C21D 8/1283 148/111 |
| 5,589,221 A * | 12/1996 | Hiramoto | B82Y 25/00 148/122 |
| 6,019,322 A | 2/2000 | Shimizu | |
| 6,068,726 A * | 5/2000 | Pohjola | B28B 11/00 156/305 |
| 6,776,709 B1 * | 8/2004 | Moore, Jr. | F24F 13/084 3/84 |
| 6,794,697 B1 * | 9/2004 | Sharma | B82Y 25/00 257/295 |
| 6,923,716 B2 * | 8/2005 | Koeger | F24F 3/16 454/187 |
| 7,278,273 B1 | 10/2007 | Whitted et al. | |
| 7,724,513 B2 | 5/2010 | Coglitore et al. | |
| 7,738,251 B2 | 6/2010 | Clidaras et al. | |
| 8,839,569 B2 | 9/2014 | Crosby, Jr. | |
| 8,875,717 B2 * | 11/2014 | Murzynski | A45D 1/00 132/163 |
| 2001/0030160 A1 * | 10/2001 | Wechsler | C02F 1/48 210/695 |
| 2002/0069599 A1 * | 6/2002 | Dhallan | F24F 13/082 52/302.1 |
| 2002/0113496 A1 * | 8/2002 | Hollis, Jr. | H02K 41/03 310/12.02 |
| 2003/0096104 A1 * | 5/2003 | Tobita | B82Y 30/00 428/332 |
| 2004/0053552 A1 * | 3/2004 | Child | B32B 5/24 442/110 |
| 2004/0214937 A1 * | 10/2004 | Miller | C08G 18/0823 524/401 |
| 2005/0225936 A1 * | 10/2005 | Day | H05K 7/20754 361/679.47 |
| 2006/0087122 A1 | 4/2006 | Sheffield | |
| 2006/0260338 A1 * | 11/2006 | VanGilder | G06F 1/20 62/259.2 |
| 2007/0003761 A1 * | 1/2007 | Miyazono | D01F 1/10 428/375 |
| 2008/0160904 A1 * | 7/2008 | Yi | F24F 13/06 454/309 |
| 2009/0058098 A1 | 3/2009 | Flynn | |
| 2010/0081371 A1 * | 4/2010 | Dinicolas | F24F 1/58 454/275 |
| 2010/0190432 A1 * | 7/2010 | Viggers | F24F 13/20 454/275 |
| 2010/0227545 A1 * | 9/2010 | Frois | B01D 46/0005 454/358 |
| 2010/0233952 A1 * | 9/2010 | Mavroudis | F24F 13/082 454/275 |
| 2010/0233953 A1 * | 9/2010 | Mavroudis | F24F 13/084 454/276 |
| 2010/0302744 A1 | 12/2010 | Englert et al. | |
| 2010/0309580 A1 * | 12/2010 | Tonooka | G11B 5/667 360/75 |
| 2011/0036234 A1 * | 2/2011 | Fisher | F41H 5/0414 89/36.02 |
| 2011/0117343 A1 * | 5/2011 | Hing | B32B 27/08 428/213 |
| 2011/0297535 A1 * | 12/2011 | Higdon | C23C 14/3407 204/298.13 |
| 2012/0153034 A1 * | 6/2012 | Venkataraghavan | F02M 47/027 239/5 |
| 2013/0232888 A1 | 9/2013 | Crosby, Jr. | |
| 2013/0293017 A1 | 11/2013 | Englert et al. | |
| 2017/0196125 A1 * | 7/2017 | Crosby, Jr. | H05K 7/20745 |

OTHER PUBLICATIONS

"Sun Modular Datacenter", 4 pages. Copyright 2004-2009 Sun Microsystems, Inc.

George H. Bryan et al., "A Simple Method for Simulating Wind Profiles in the Boundary Layer of Tropical Cyclones," Boundary-Layer Meteorol, 2017, 162:475-502, Springer, United States of America.

Jean-Pierre Tasu et al., "Estimation of Pressure Gradients in Pulsatile Flow From Magnetic Resonance Acceleration Measurements," Magnetic Resonance in Medicine, 2000, 44:66-72, Wiley-Liss, Inc., United States of America.

* cited by examiner

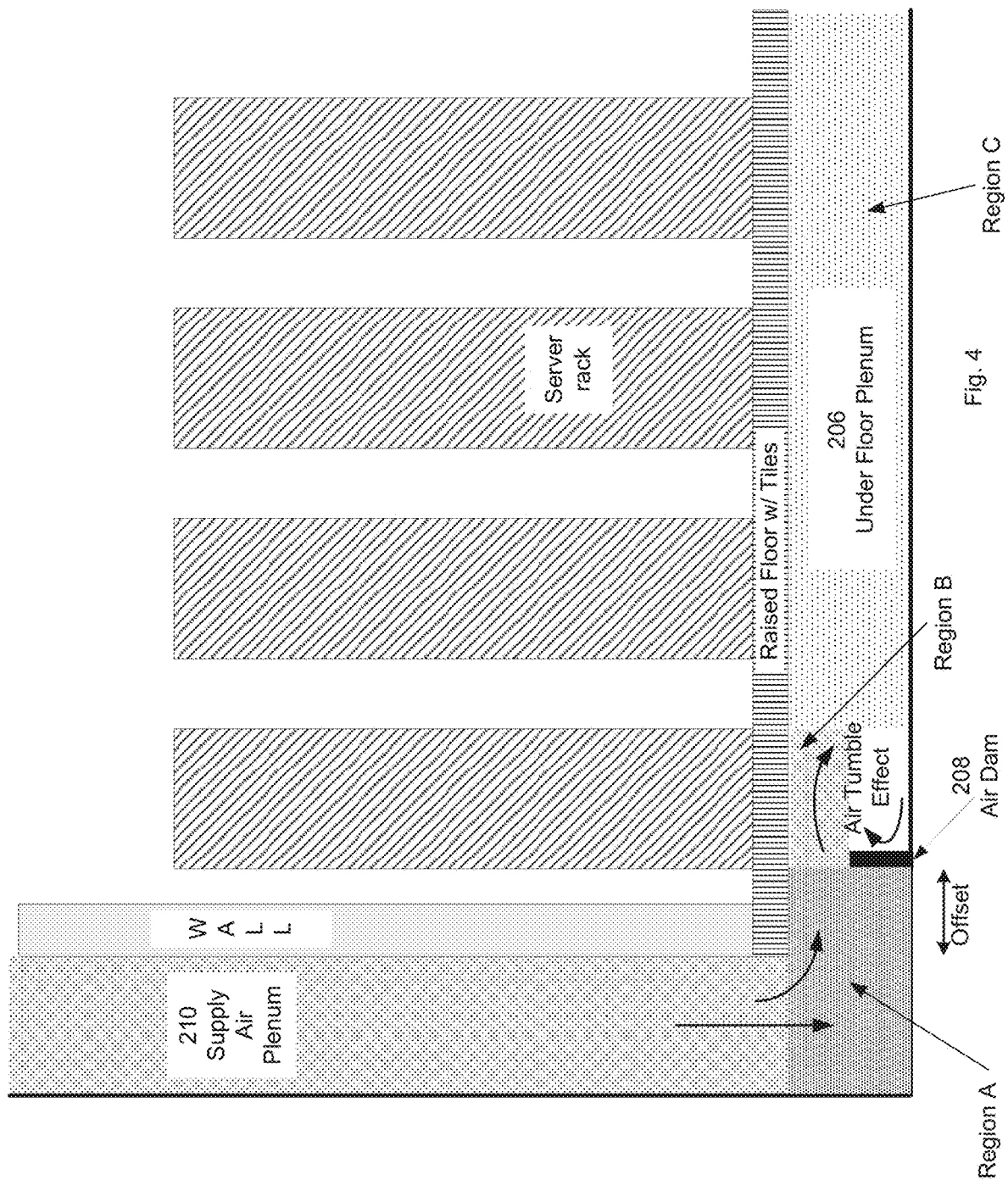

```
                    ┌─ Start ─┐
                         │
                         ▼
```

Cooling air is forced into a data room of the datacenter facility through a supply air plenum under a raised floor of the data room, where the data room houses computing systems in the datacenter facility, where the computing systems includes servers and storage devices arranged in hot and cool zones, and air flow of the cooling air cools the computing systems in the data room by passing the air through one or more perforated tiles or other open areas in the raised floor of the data room
1202

A distribution of the cooling air is customized through one or more perforated tiles or other open areas in the raised floor of the data room by placing one or more magnetic blocking tiles in a pattern to lay on top of the one or more of the perforated floor tiles or other open areas
1204

The cooling air flow through the perforated floor tiles or other open areas to areas is cut off where the computing systems are not installed; and thus, enhancing the air flow to areas in the datacenter where the computing systems are designed to be located and actually are installed in the datacenter, where the magnetic blocking tiles have a top surface that is solid and a bottom surface, where the magnetic blocking tiles adhere magnetically to either the raised floor or the perforated tiles
1206

The magnetic blocking tiles are placed in two or more distinct areas of one or more data rooms to allow data center operators to place the magnetic blocking tiles throughout the facility to manage air flow properly and increase an efficiency of the cooling of the computer systems in the datacenter facility
1208

```
                              ┌─ Start ─┐
                                   │
                                   ▼
```

1210 — The magnetic blocking tiles are placed in two or more distinct areas of one or more data rooms to allow a precision commissioning of a datacenter facility by allowing one or more data floors to be constructed with its full complement of perforated tiles and openings for air flow to support a maximum designed capacity of computing systems in each data floor but then through use of the placement of the magnetic blocking tiles over the perforated tiles and openings where the computing systems are designed and planned to be located but currently are not installed, then this placement the magnetic blocking tiles allows the data center operators to refine the heat load being cooled by the HVAC systems of the data center to focus on cooling computing systems actually currently installed in the one or more data floors that are already constructed.

1212 — A pressure of the air through the one or more perforated tiles or other open areas in the raised metal floor of the data room is evenly distributed by passing the cooling air over an air dam positioned at an entry to a supply air plenum under the raised floor, where the air dam is configured to cooperate with the placement of the one or more magnetic blocking tiles in the pattern to lay on top of one or more of the perforated floor tiles or other open areas, wherein a placement of the computing systems is configured to be freely placed in any geographical area in the data room rather than having to set up the computing equipment in prescribed hot and cold zones

1214 — The cooling air is forced into a primary supply air plenum along a space within a vertical wall of the data room, wherein the primary supply air plenum is connected to the supply air plenum under the raised floor and oriented perpendicular thereto, and the air dam is positioned in a transition region between the primary supply air plenum and the under raised floor supply air plenum such that a positive relative pressure is maintained across all of the perforations in the raise floor, and positioning a height of the air dam such that the air dam is less than approximately three-quarters of a height of the raised floor supply air plenum, with an offset and height positioned to create a generally even positive pressure across the raised floor.

Figure 12B

End

US 10,609,843 B2

MAGNETIC BLOCKING TILES FOR A DATACENTER FACILITY

RELATED APPLICATIONS

This application claims the benefit of and claims priority as a continuation in part to U.S. Non-Provisional application Ser. No. 14/041,351, filed Sep. 30, 2013, which itself claims priority to U.S. Provisional Application Ser. No. 61/709,429, filed Oct. 4, 2012, both of which are herein incorporated by reference in their entirety.

BACKGROUND

In general, an embodiment relates to building a datacenter facility. Information Technology operations are a crucial aspect of most organizational operations in the western world. One of the main concerns is business continuity. Companies rely on their information systems to run their operations. If a system becomes unavailable, company operations may be impaired or stopped completely. It is necessary to provide a reliable infrastructure for IT operations, in order to minimize any chance of disruption. Information security is also a concern, and for this reason a data center has to offer a secure environment, which minimizes the chances of a security breach. A data center must therefore keep high standards for assuring the integrity and functionality of its hosted computer environment. Telcordia GR-3160, NEBS Requirements for Telecommunications Data Center Equipment and Spaces, provides guidelines for data center spaces within telecommunications networks, and environmental requirements for the equipment intended for installation in those spaces.

Putting a large number of electrical components into a single enclosed space, such as a room, creates a ventilation problem as the area must be maintained at a desired operating temperature, while having a large number of heat sources. Traditional systems may create custom ducting to direct supply air into desired locations within a data center facility. Alternatively, through floor or ceiling supply paths may be created by forcing air in through grated floor or ceiling sections. However, the present designs still suffer from localized heating and cooling caused by inadequate air distribution through the space.

SUMMARY

In an embodiment, a distribution of the cooling air through one or more perforated tiles or other open areas in the raised floor of the data room is customized by placing one or more magnetic blocking tiles in a pattern to lie on top of the one or more of the perforated floor tiles or other open areas. The cooling air flow through the perforated floor tiles or other open areas to areas where the computing systems are not installed is cut off; and thus, the air flow is directed flow areas in the datacenter where the computing systems are designed to be located and actually are installed in the datacenter. The magnetic blocking tiles have a top surface that is solid and a bottom surface. The magnetic blocking tiles adhere magnetically to either the raised floor or the perforated tiles.

In an embodiment, one or more magnetic blocking tiles may have an anti static rating of at least 10,000 ohms and are made of or coated with a dust-resistant material. The one or more magnetic blocking tiles are designed to be placed on perforated tiles or open areas where air could flow in a datacenter to aid in controlling the air flow in a datacenter. The datacenter houses computing systems, where the computing systems includes servers and storage devices arranged in hot and cool zones. The magnetic blocking tiles are placed on perforated tiles or open areas where air could flow through the floor. The magnetic blocking tiles are placed on these perforated tiles or these open areas, in an area where electronic equipment, including the computing systems, is designed and planned to be located but currently is not installed. Thus, the magnetic blocking tiles cut off the air flow to areas where the electronic equipment is designed and planned to be located but currently is not installed. The magnetic blocking tiles cut off the air flow to areas where the electronic equipment is not installed; and thus, directs the air flow to areas in the datacenter where electronic equipment is designed to be located and actually is installed in the datacenter. The magnetic blocking tiles adhere magnetically to either the floor or the perforated tiles.

BRIEF DESCRIPTION OF THE DRAWINGS

The drawings refer to embodiments of the design in which:

FIG. 2A is a cut away perspective view of the interior of the data room, under floor plenum, and supply air plenum, while FIG. 2B is a two-dimensional front view of the cut-away perspective of FIG. 2A.

FIG. 4 illustrates an exemplary air flow and corresponding gross pressure regions of the source air through the supply air plenum, past the air dam, and into the under floor plenum.

FIG. 5A illustrates an exemplary pressure distribution for embodiments incorporating an air dam according to embodiments of the present description, while FIG. 5B illustrates an exemplary pressure distribution for conventional systems without an air dam.

FIGS. 12A and 12B illustrate diagrams of an embodiment of an example method of ventilating a datacenter facility.

Figure 1:
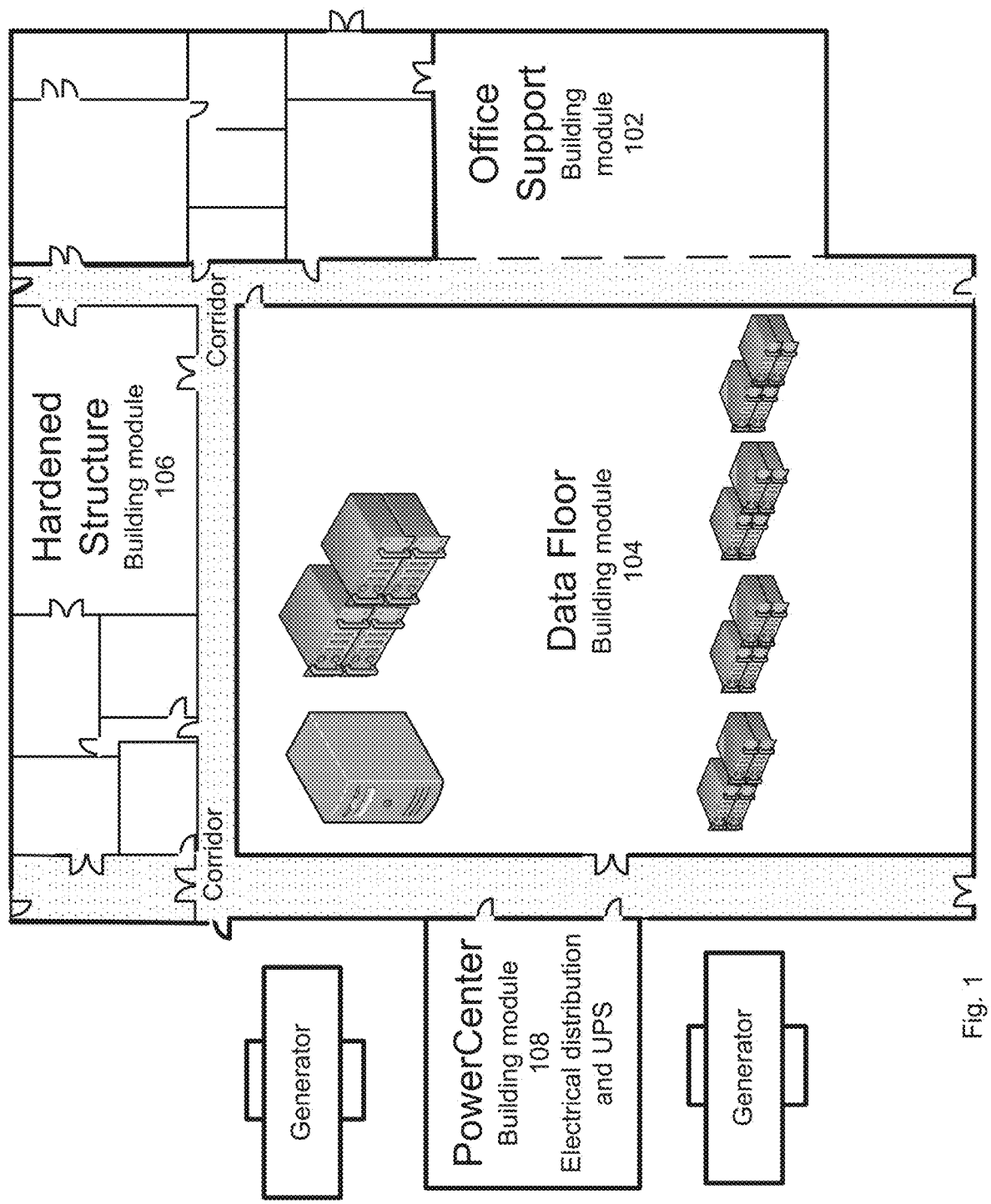
FIG. 1 illustrates a block diagram of an embodiment of an initial modular datacenter facility constructed with a set of building modules of different types of functionality to form an entire datacenter facility having a standardized pre-approved architectural design and layout.

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DETAILED DISCUSSION

In the following description, numerous specific details are set forth, such as examples of specific heights and dimensions, named components, connections, types of offices, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. Example processes for and apparatuses to manage cooling for a datacenter facility are described. The following drawings and text describe various example implementations of the design.

In general, various methods and apparatuses associated with a magnetic blocking tile that cuts off the air flow to areas where the electronic equipment is not installed are discussed. The magnetic blocking tile is placed on a perforated tile or open area where air could flow through the floor to direct the air flow to areas in the datacenter where electronic equipment is designed to be located and actually is installed in the datacenter. This increases the efficiency of the cooling system of the data center facility. The placement of magnetic blocking tiles may cooperate with an air dam installed in the supply air system of the data center. FIGS. 9-11B illustrate the placement of placement of magnetic blocking tiles and FIGS. 1-8 illustrate an example air dam system that cooperate with the placement of magnetic blocking tiles.

Figure 9:
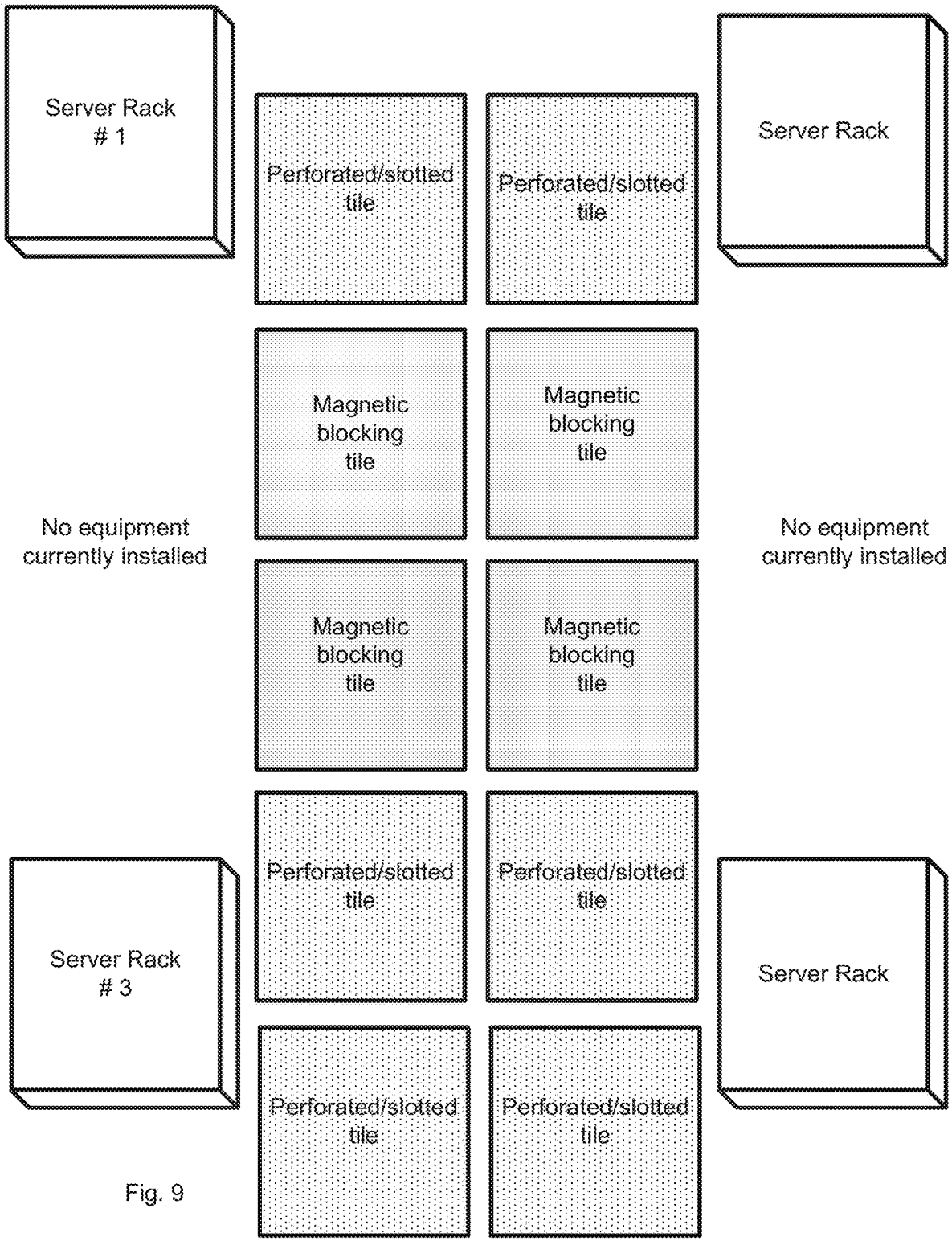
FIG. 9 illustrates a diagram of an embodiment of four magnetic blocking tiles placed on perforated tiles or open areas, in an area where electronic equipment, including various computing systems, is designed and planned to be located but currently is not installed.

FIG. 9 illustrates a diagram of an embodiment of four magnetic blocking tiles placed on perforated tiles or open areas, in an area where electronic equipment, including various computing systems, is designed and planned to be located but currently is not installed.

The magnetic blocking tiles each have a top surface that is solid and a bottom surface. Each magnetic blocking tile may have an anti static rating of at least 10,000 ohms and is made of or coated with a dust-resistant material. The one or more magnetic blocking tiles are designed to be placed on perforated tiles or open areas where air could flow in a datacenter to aid in controlling the air flow in a datacenter. The datacenter houses computing systems, where the computing systems includes servers and storage devices are arranged in hot and cool zones. The magnetic blocking tiles are placed on perforated tiles or open areas where air could flow through the floor. The magnetic blocking tiles are placed on these perforated tiles or these open areas, in an area where electronic equipment, including the computing systems, is designed and planned to be located but currently is not installed; and thus, the magnetic blocking tiles cut off the airflow to areas where the electronic equipment is designed and planned to be located but currently is not installed. The magnetic blocking tiles cut off the airflow to areas where the electronic equipment is not installed; and thus, enhances the airflow to areas in the datacenter where electronic equipment is designed to be located and actually is installed in the datacenter. For example, server racks 1 and 3 are still getting the cooling air flow to the area where they are installed. However the area between server racks 1 and 3 has magnetic blocking tiles placed over the perforated tiles in this area. The magnetic blocking tiles adhere magnetically to either the floor or the perforated tiles in order to cut off the airflow to areas where the electronic equipment is not installed.

The magnetic blocking tiles are a device to manage airflow in a raised access floor environment where the main air distribution in that area is done through a perforated or slotted tile. Also, the open areas in the floor are either i) formed in the floor or ii) adjacent to the sides of the floor.

The magnetic blocking tiles are a magnetic cover for a perforated or slotted tile that is safe for a computing environment such as a data center. Data center managers can optimize the cooling capacity of theft computer rooms using an effective sealing blocking panel/tile.

As discussed, a data center facility is a large facility designed to support large numbers of servers in a large conditioned room. Data Centers are usually composed of a large number of racks (25 or more) and are manned 24 hours a day, 7 days a week, and 365 days a year. Computing systems are housed in the datacenter facility. The computing systems include servers and storage devices arranged in hot and cool zones, routers and switches that transport data traffic between the servers as well as transport traffic to a world exterior to the modular data center facility.

Hot/Cold Aisles:

A method of arranging computer racks which focuses cold air delivery at the front intake of a rack and expels hot air at the back. Rack rows are arranged so the backs of rows face each other and hot air is collected above the row by a ceiling plenum, which returns the air to the HVAC unit directly. The fronts of the racks face each other in a row that has vented tiles in the raised floor to deliver cold air to the rack fronts from the HVAC units.

The magnetic blocking tiles are configured to cooperate with an air dam installed in the data center, where a supply air plenum connects to an under floor plenum to supply the cooling air to the under floor plenum, where the supply air plenum is positioned adjacent an interior wall; and the air dam is positioned at an entry region of the under floor plenum to obstruct a flow of cooling air from the supply air plenum in order to cause a constant airflow through the perforations in the perforated tiles for an entire area of datacenter housing the computer systems.

Figure 10:
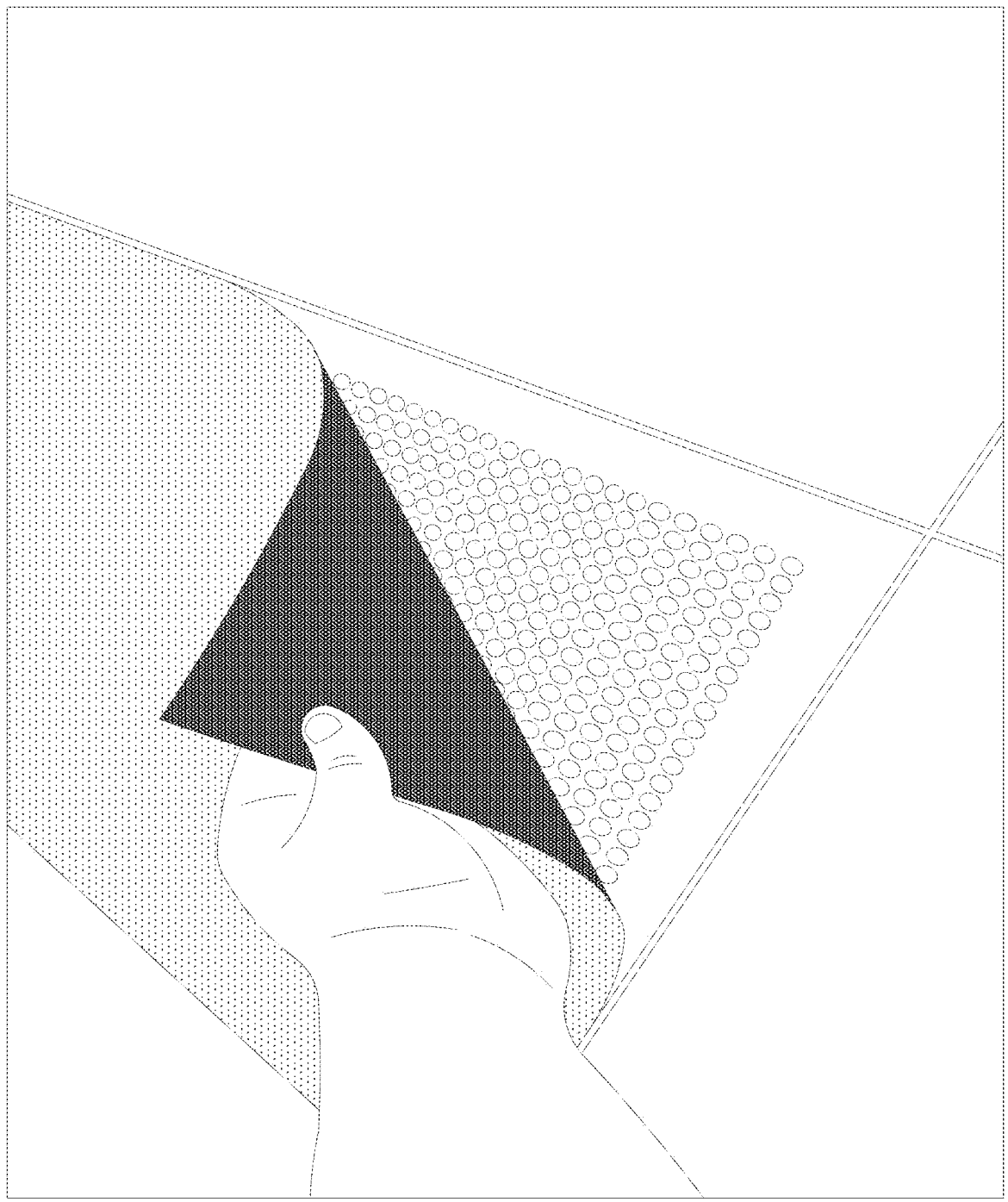
FIG. 10 illustrates a diagram of an embodiment of a flexible magnetic blocking tile being pealed back off a perforated floor tile.

FIG. 10 illustrates a diagram of an embodiment of a flexible magnetic blocking tile being pealed back off a perforated floor tile. The magnetic blocking tile has a top surface and a bottom surface. The bottom surface of the magnetic blocking tiles may consist of a magnetic backing strip used to adhere to a raised metal floor or a metal perforated floor tile. The raised metal floor may be created with a ferrous metal material or has a coating put onto the raised floor that incorporates loose ferrous metal material. Likewise, the perforated floor tile may be created with a ferrous metal material or has a coating put onto the perforated floor tile.

Each magnetic blocking tile may have a magnetic flux, of less than 0.4 Tesla or 1500 Oersted, at which value it is safe to assume that the magnetic field will not harm or alter data bits stored in memory device. Magnetic flux is (often denoted $\Phi$ or $\Phi_B$) is a measure magnetism through a surface. Magnetic flux is the surface integral of the normal component of the magnetic field B passing through that surface. The SI unit of magnetic flux is the Weber (Wb). When measured over an area, then the unit is the Telsa, which equals a Weber per Meter squared. The Weber is commonly expressed in a multitude of other units:

$$Wb = \frac{kg \cdot m^2}{s^2 \cdot A} = V \cdot s = T \cdot m^2 = \frac{J}{A} = 10^8 \, Mx$$

where Wb=weber, V=volt, T=tesla, J=joule, m=meter, s=second, A=ampere, and Mx=maxwell.

Data bits are stored in memory device in a magnetic like field of their own. Interesting in this context, the magnetic force required to affect another magnetic field. This magnetic force is measured in Oersted. Generally less than 1500 Oersted and/or less than 0.4 Telsa is a maximum defined value at which it is safe to assume that no data has had its value changed based on being exposed to the magnetic field. Past this exposure, data may have been altered by the magnetic field. Do note, regardless of exposure to another magnetic force, that in practice, a memory device such as a hard drive can (and does) lose data bits due to deterioration over time.

The magnetic blocking tiles may have a magnetic material incorporated into one of the layers of the magnetic blocking tiles. The magnetic material is used to adhere to either a metal floor or metal perforated tiles without an additional adhesive bonding agent being needed between the magnetic blocking tile and an underlay surface of the metal floor or metal perforated tile. The floor or perforated tile may be made out of a ferrous metal material and/or have a ferrous-metal based resin applied to the floor or perforated tile. The magnetic blocking tiles are configured for a magnetic action to be used to hold the magnetic blocking tile in place. Note, any of 1) a raised floor may be made of a ferrous metal, 2) the perforated tiles are made of a ferrous metal, and 3) a coating, on either of the perforated tiles or on the raised floor, incorporates loose ferrous metal material.

The perforated tiles include any tiles manufactured with slots, small holes, and other openings in the tile to allow air to flow through these openings.

In data centers built without a raised floor, the magnetic blocking tiles may be placed on ventilation ducts in the ventilation duct work in the data center. The magnetic blocking tiles are configured to snap into place and adhere onto the perforated or slotted tile, or the ventilation duct.

In an embodiment, the magnetic blocking tiles are configured to be covering material, for walls or floorings, to be laid on an underlay surface without an adhesive bonding between the magnetic blocking the and the underlay surface. The magnetic blocking tiles uses a magnetic attraction force integrated into the underside material of the magnetic blocking the during manufacturing. The magnetic blocking toes are configured for a magnetic action to be used to hold the magnetic blocking tile in place. The backing magnetic material is incorporated into one of the layers of the magnetic blocking tiles. The magnetic blocking the is laid on a ferrous metal surface, to be held in place by magnetism. The underlay floor or wall can be created with either magnetic or ferrous metal units, or a coating can be put onto the floor or perforated tile, which can incorporate loose magnetic material or ferrous metal material. In a multiple-layer blocking/covering tile, the magnetic loose material, such as ferromagnetic iron powder, is held between the layers by an adhesive or bonding agent within that magnetic block the structure. The structure of the magnetic blocking the is simple and economically produced, for easy laying and for it to remain in place without distortion.

In an embodiment, the dust resistant coating or material of the magnetic blocking the has a reduced tacticity of a top layer or covering to protect the surface from dust accumulation. The top layer may have small molecules that repel negatively charged dust or may repel dust that could have remained attached by sealing edges, joints, and seems that are vulnerable to dust molecules attaching to these seems, edges and joints.

The magnetic blocking tiles may come in various shapes including square tiles, isosceles triangle tiles, right triangle tiles, equilateral triangle tiles, and rectangular tiles. The shape and size of the magnetic blocking tile may match the shape and size of the perforated tile or opening in the floor that the magnetic blocking tile is covering. A thickness and top layer of the magnetic blocking tile is configured and made of a material to be durable enough for carts carrying equipment, potentially including server racks, desks and even a mainframe, weighing up to 1500 pounds to roll over the first magnetic blocking tile without permanently deforming or damaging the first magnetic blocking tile. For example a magnetic blocking tile may have a 20 to 100 mm thickness from the top surface to the bottom surface. The material and thickness of the magnetic blocking tile allows for both being 1) durable enough to support carts carrying equipment weights of up to 1500 pounds rolling over the tiles without permanently deforming the first magnetic blocking tile as well as 2) having enough cushion to give some relief to a fatiguing of a person standing on the tiles. The magnetic blocking tile is designed to allow people to regularly walk on these tiles without damaging. Thus, the magnetic blocking tiles are configured to be durable. The magnetic blocking tiles are configured to also be easy to clean.

The magnetic blocking tiles may have a coating that has an anti static rating of at least 10,000 ohm to a maximum of $10^{12}$ ohms to prevent damage to any electronic circuit devices that cannot tolerate a sudden flow of static charge. The magnetic blocking tiles are Anti-static to be suitable for use in Computer rooms. Electrostatic discharge (ESD) is a problem for computer systems in a data floor. The scuff of a shoe or the scrape of a chair creates an electron imbalance and, while the human body may not feel it, it can have serious consequences. ESD can cause component or system failures, which may prove costly and perhaps even be dangerous. The magnetic blocking tiles may have a static electricity electrical propensity of less than 2 kV by having a conductive carbon based coating to create an anti static property.

The top surface of a magnetic blocking tile may have a sufficient friction coefficient of equal to or greater than a 0.30 dynamic coefficient of friction (DCOF) to be slip resistant and give some friction so a person does not easily slip. The top surface of a magnetic blocking tile may be made from material such as vinyl.

Figure 11A:
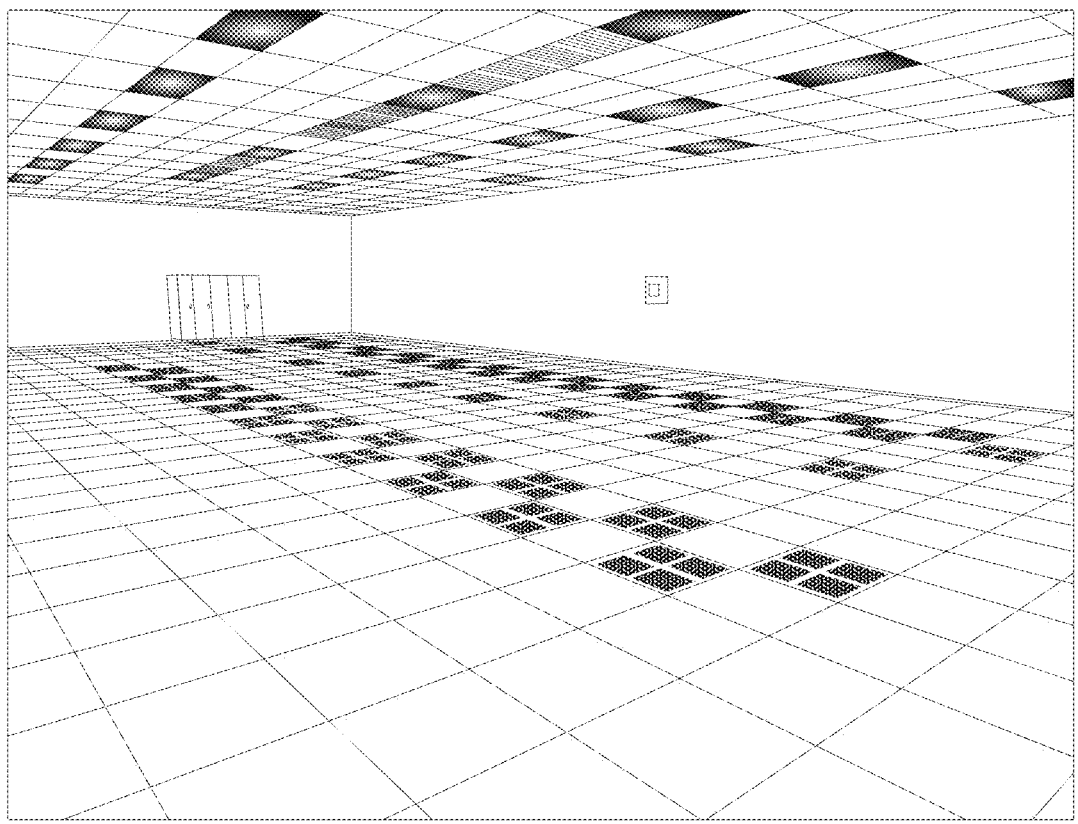
FIG. 11A illustrates a diagram of an embodiment of a section of perforated floor tiles interspersed with regular solid floor tiles in an area where electronic equipment is designed and planned to be located but currently is not installed.

FIG. 11A illustrates a diagram of an embodiment of a section of perforated floor tiles interspersed with regular solid floor tiles in an area where electronic equipment is designed and planned to be located but currently is not installed.

Figure 11B:
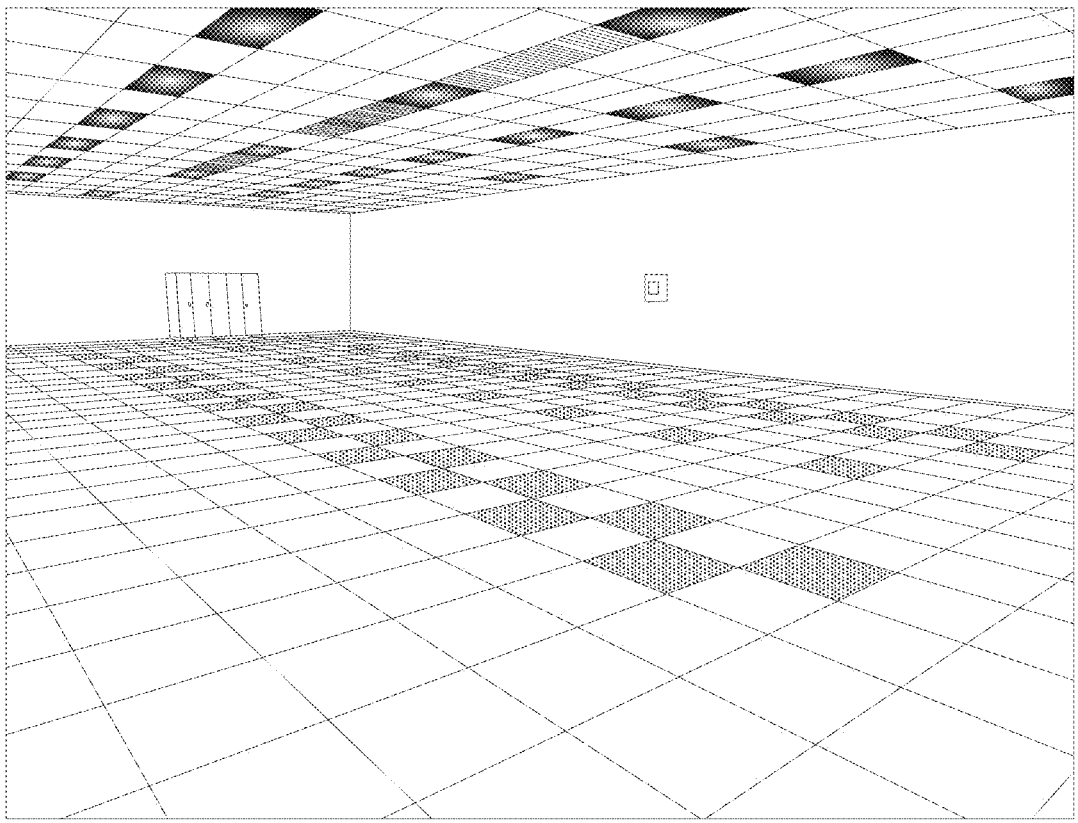
FIG. 11B illustrates a diagram of an embodiment of the same section of perforated floor tiles, with a customized distribution of the cooling air through one or more perforated tiles or other open areas in the raised floor of the data room by placing one or more magnetic blocking tiles in a pattern to lay on top of the one or more of the perforated floor tiles or other open areas.

FIG. 11B illustrates a diagram of an embodiment of the same section of perforated floor tiles, with a customized distribution of the cooling air through one or more perforated tiles or other open areas in the raised floor of the data room by placing one or more magnetic blocking tiles in a pattern to lay on top of the one or more of the perforated floor tiles or other open areas. FIG. 11B shows magnetic blocking tiles laid on all of the perforated floor tiles because no electronic equipment is currently installed in this area of the data center facility. The magnetic blocking tiles can be placed in a pattern to lie on top of the perforated floor tiles. The magnetic blocking tiles cut off the air flow to areas where electronic equipment is designed and planned to be located but currently is not installed; and thus, enhance the air flow to areas in the datacenter where electronic equipment is designed to be located and actually is installed in the datacenter. A variety of patterns may be used when placing magnetic blocking tiles onto perforated tiles. A magnetic blocking tile may be placed on each and every perforated tile where electronic equipment has not yet been installed. A magnetic blocking tile may be placed in another pattern such as on every other perforated tile where electronic equipment has not yet been installed. One or more magnetic blocking tiles may be placed in another pattern such as half of a standard sized magnetic tile place on a perforated tile where electronic equipment is installed but does not need that much cooled air flow.

Cooling air is forced into a data room of the datacenter facility through a supply air plenum under a raised floor of the data room. Airflow of the cooling air cools the computing systems in the data room by passing the air through one or more perforated tiles or other open areas in the raised floor of the data room. A distribution of the cooling air through one or more perforated tiles or other open areas in the raised floor of the data room may be customized by placing one or more magnetic blocking tiles in a pattern to lie on top of the one or more of the perforated floor tiles or other open areas. The cooling airflow through the perforated floor tiles or other open areas to areas is cut off where the computing systems are not installed. Thus, the magnetic blocking tiles enhance the airflow to areas in the datacenter where the computing systems are designed to be located and actually are installed in the datacenter. The magnetic blocking tiles adhere magnetically to either the raised floor or the perforated tiles.

The magnetic blocking tiles may be placed in two or more distinct areas of one or more data rooms in order to allow data center operators to place the magnetic blocking tiles throughout the facility to manage air flow properly and increase an efficiency of the cooling of the computer systems in the datacenter facility. In a datacenter, computing systems from multiple different entities may all be housed in the same data center facility. The computing system from each different entity may be housed in generally separate areas such as each entity is given its own cage or protected area in the datacenter.

The magnetic blocking tiles may also be placed in two or more distinct areas of one or more data rooms to allow a precision commissioning of a datacenter facility by allowing one or more data floors to be constructed with its full complement of perforated tiles and openings for air flow to support a maximum designed capacity of computing systems in each data floor. Thus, a data center may be built to house, electrical power and cool, for example, 2 megawatts worth of computing systems. However, through use of the placement of the magnetic blocking tiles over the perforated tiles and openings where the computing systems are designed and planned to be located but currently are not installed, then this placement the magnetic blocking tiles allows the data center operators to refine the heat load being cooled by the HVAC systems of the data center to focus on cooling computing systems actually currently installed in the one or more data floors that are already constructed. The magnetic blocking tiles are configured to calibrate data center.

As discussed, the placement of magnetic blocking tiles may cooperate with an air dam installed in the supply air system of the data center. The air dam works as an obstruction in the forced air flow path to cause the air passing through the opening between the top of the air dam and the bottom of the wall or raised floor to slow down the air entering the under floor space. The air on the opposing side of the air dam from the incoming air stream experiences a more even pressure distribution. The air dam also creates a positive air pressure over the air dam, thus reducing and eliminating negative pressures areas in the data room floor. The air dam is located under a raised floor building such as a data center and is typically located under the walls forming a room in the building in the flow path of forced air in that building. Additional localized air dams may be placed and orientated by high heat centers in a room to direct airflow to that localized hot spot. The air dam can be located between the slab of the foundation and the support structure for the raised floor.

FIGS. 12A and 12B illustrate diagrams of an embodiment of an example method of ventilating a datacenter facility. In step 1202, cooling air is forced into a data room of the datacenter facility through a supply air plenum under a raised floor of the data room, where the data room houses computing systems in the datacenter facility, where the computing systems includes servers and storage devices arranged in hot and cool zones, and air flow of the cooling air cools the computing systems in the data room by passing the air through one or more perforated tiles or other open areas in the raised floor of the data room.

In step 1204, a distribution of the cooling air is customized through one or more perforated tiles or other open areas in the raised floor of the data room by placing one or more magnetic blocking tiles in a pattern to lay on top of the one or more of the perforated floor tiles or other open areas.

In step 1206, the cooling air flow through the perforated floor tiles or other open areas to areas is cut off where the computing systems are not installed; and thus, enhancing the air flow to areas in the datacenter where the computing systems are designed to be located and actually are installed in the datacenter, where the magnetic blocking tiles have a top surface that is solid and a bottom surface, where the magnetic blocking tiles adhere magnetically to either the raised floor or the perforated tiles.

In step 1208, the magnetic blocking tiles are placed in two or more distinct areas of one or more data rooms to allow data center operators to place the magnetic blocking tiles throughout the facility to manage air flow properly and increase an efficiency of the cooling of the computer systems in the datacenter facility.

In step 1210, the magnetic blocking tiles are placed in two or more distinct areas of one or more data rooms to allow a precision commissioning of a datacenter facility by allowing one or more data floors to be constructed with its full complement of perforated tiles and openings for air flow to support a maximum designed capacity of computing systems in each data floor but then through use of the placement of the magnetic blocking tiles over the perforated tiles and openings where the computing systems are designed and planned to be located but currently are not installed, then this placement the magnetic blocking tiles allows the data center operators to refine the heat load being cooled by the HVAC systems of the data center to focus on cooling computing systems actually currently installed in the one or more data floors that are already constructed.

In step 1212, the pressure of the air through the one or more perforated tiles or other open areas in the raised metal floor of the data room is evenly distributed by passing the cooling air over an air dam positioned at an entry to a supply air plenum under the raised floor. The air dam is configured to cooperate with the placement of the one or more magnetic blocking tiles in the pattern to lay on top of one or more of the perforated floor tiles or other open areas. The placement of the computing systems is now configured to be freely placed in any geographical area in the data room rather than having to set up the computing equipment in prescribed hot and cold zones.

In step 1214, the cooling air is forced into a primary supply air plenum along a space within a vertical wall of the data room, wherein the primary supply air plenum is connected to the supply air plenum under the raised floor and oriented perpendicular thereto, and the air dam is positioned in a transition region between the primary supply air plenum and the under raised floor supply air plenum such that a positive relative pressure is maintained across all of the perforations in the raise floor, and positioning a height of the air dam such that the air dam is less than approximately three-quarters of a height of the raised floor supply air plenum, with an offset and height positioned to create a generally even positive pressure across the raised floor.

In general, the system includes a datacenter with a floor and a raised floor elevated from the floor and an interior wall and an exterior wall in which cooling air is supplied to an interior space of the datacenter by injecting the cooling servers air through perforations within the raised floor. Accordingly, an under floor plenum under the entire raised floor and a supply air plenum connected to the under floor plenum and positioned adjacent the interior wall is used to supply the air to the interior space of the data center. Embodiments as described herein include an air dam positioned at an entry region of the under floor plenum to obstruct the flow of the cooling air from the supply air plenum in order to cause a constant airflow through the perforations of the raised floor for an entire area of datacenter housing the computer systems. The air dam is used to create a positive pressure across the entire raised floor and create a generally constant air pressure at the raised floor such that the air is supplied into the interior space substantially evenly.

The air dam causes an obstruction in the cooling air supply pathway that permits a constant airflow through the entire area of the data room in a data center that has a raised floor system. The generally even pressure distribution results in a constant airflow through the perforated tiles mounted on the raised floor, and thus into all of the areas of the data room. This even airflow distribution allows a freedom of placement of electrical equipment, including the servers and storage equipment, within/inside the room. The electrical equipment can be arranged and placed in any area of the room in any organizational fashion.

The size and shape of the air dam may vary. An embodiment of the air dam may have an 'L' type shape with the height of the L section being roughly half the height of the raised floor. The size and shape of the air dam causes a constant pressure through the perforated tiles when entering into the data floor to cool its electronic equipment. The angle of the vertical section of the air dam may vary between 45° and 120°, with a preferred angle of 90° or less, measured from the floor on the exterior side of the air dam. The placement of the air dam may be offset relative to the wall starting that room by a given distance of between approximately 6 to 18 inches. The size and shape of the air dam is formed to cause a turbulent airflow effect underneath the raised floor and then through the perforations in tiles on a surface of the raised floor in order to create the constant pressure through the perforated tiles.

The offset placement tends to control where the constant air pressure and thus air flow in cubic feet per minute (CFM) begins. The constant airflow caused by the air dam through the under floor system to the entire room of the data floor tends to minimize or eliminate hotspots from occurring inside the room. This allows greater freedom of placement and arrangement of electrical equipment inside the data room than ever before. Additionally, a layout of electrical equipment can be altered and changed in the future without having to potentially change any HVAC ducting, HVAC cooling units, etc. and potentially with only a minimal amount of switching around or adding of perforated tiles to affect the airflow in that area of the data floor room. The even air pressure distribution caused by the air dam in the under floor plenum, which results in a constant airflow through the perforated floor system, allows an electrical equipment layout in the data floor with even smaller dimensions for hot and cold aisles than standard configurations. For example, 3 foot or less hot aisles and/or 4 foot or less cold aisles may be achieved with embodiments described herein. Thus, the placement of electrical equipment such as servers, storage devices, etc. can be freely placed in any geographical area in the data room rather than having to set up the equipment in a prescribed/pre-designed manner.

The rooftop HVAC cooling units and cooling system overall perform better to consume less electrical energy to supply a given amount of cooling for a given amount of electrical consumption by the electrical equipment contained inside the data floor room. For example, due to the constant airflow and consistent pressure, a 10,000 square-foot data room can fit 500 racks of electrical equipment in multiple layouts and arrangements inside that data room floor space of 10,000 feet. The same rooftop HVAC units and air dam placement can be used to support those multiple configurations of electrical equipment within the data floor of the data center.

An exemplary embodiment may be used in a datacenter facility. Information Technology operations are a crucial aspect of most organizational operations in the western world. One of the main concerns is business continuity. Companies rely on their information systems to run their operations. If a system becomes unavailable, company operations may be impaired or stopped completely. It is necessary to provide a reliable infrastructure for IT operations, in order to minimize any chance of disruption.

An exemplary datacenter facility that may incorporate features of the air dam described herein may comprise a modular datacenter facility constructed with a set of building modules of different types of functionality to form an entire datacenter facility having a standardized pre-approved architectural design and layout. An exemplary modular datacenter facility is described in the co-pending application U.S. patent application Ser. No. 13/792,948, filed Mar. 11, 2013, incorporated in its entirety herein.

An exemplary modular datacenter facility has all instances of a particular type of building module with approximately the same floor plan and architectural design. An initial set of building modules can be built upon a parcel of land, and then as needs of space and additional capacity of the modular datacenter facility increase, then at a future point in time additional building modules of the different types can be rapidly added to the initial set of building modules. The building modules of the different types use one or more connecting corridors architected into at least a first type of building module and corresponding aligned doorways between both building modules to interconnect two building modules adjacent and abutted to each other.

FIG. 1 illustrates a block diagram of an embodiment of an initial modular datacenter facility constructed with a set of building modules of different types of functionality to form an entire datacenter facility having a standardized pre-approved architectural design and layout.

The modular datacenter facility is constructed with a set of building modules of different types of functionality to form/make up an entire datacenter facility having a standardized pre-approved architectural design and layout. Each type of building module in the set has a specific collection of functionality associated with that type of building module. Each type of building module, such as a hardened-structure building module 106, a data-floor building module 104, a power-center building module 108, and an office-support building module 102, has a specific set of functionality associated with that building module. Each building module of the different types is a pre-engineered, standardized building block containing architectural features to allow easy configuration and integration with the other building modules that form the modular datacenter facility. All instances of a particular building module with that type of functionality will have approximately a same floor plan and architectural design. Small changes can be made to the interior of a given building modules design but in general, the floor plan and architectural design remain the same. Components making up each of the building modules 102-108 are prefabricated and shipped to the parcel of land.

The modular datacenter facility houses computing systems in a data-floor building module 104. The computing systems includes servers and storage devices housed in hot and cool zones, as well as routers and switches that transport data traffic between the servers as well as transport traffic to a world exterior to the modular data center facility. The modular datacenter facility also includes redundant or backup power supplies, redundant data communications connections, environmental cooling controls, and security devices.

The data-floor building module 104 is the principal module of the datacenter as it provides the hardened environment for the computing systems that includes the server room. The data-floor building module 104 is approximately 10,000 square feet and works in unison with the power-center building module 108 to provide one MW of UPS power at a 2N redundancy. This power center building module 108 is prefabricated off site and it includes everything in the design electrical system. Each power-center building module 108 includes Switchgear, an Uninterruptable Power Supply, Power Controls, is associated with a data-floor building module 104. The data-floor building module 104 structure also supports the N+1 mechanical system that features airside economization and delivers high-efficiency cooling via 2 air chases a long the walls of the data-floor building module, the main datacenter, and a 36-inch raised floor system.

The data-floor building module 104 is the heart of the datacenter environment as it contains the computing systems. The data-floor building module 104 supports racks of servers having densities varying in power consumption from 2 kW to 20 kW without containment walls between the racks of servers of varying power consumption density. The data-floor building module 104 has a multitude of 80' steel joists horizontally connecting parallel sections of wall of the building module to eliminate a need for support columns being located on the 10,000 square feet of raised 36-inch floor that supports the computing systems. The joists creating an open floor space ensures that users of the data-floor building module 104 will have a maximum degree of flexibility to accommodate a variety of potential server rack configurations in the hot and cold zones of the data-floor building module 104. The raised 36-inch floor houses the computing systems as well as creates a dual plenum for air supply with cooling supply air being supplied underneath the raised floor as well as a ceiling plenum for hot air return.

The data-floor building module 104 containing the computing systems also has a cooling system on its roof that features airside economization. In an example embodiment, the data-floor building module 104 uses packaged air handlers to control the air temperature and moisture of the data floor environment. The modular datacenter's mechanical infrastructure comprises four 120 Ton Trane Intellipak units with outside air economization capabilities in a N+1 configuration. These roof top units have variable frequency drives that increase the efficiency of the unit in the entire load spectrum. These packaged air handlers are installed in the roof and they support full outside air economization. Additionally, the power-center building module 108 is supported by two (2) 15 Ton Trane packaged air handlers.

The building modules of the different types 102-108 use one or more connecting corridors architected into at least a first type of building module and corresponding aligned doorways between both building modules to interconnect two building modules adjacent and abutted to each other.

Initially, all four types of building modules 102-108 will be built onto a given geographic plot of land. At a later/future point in time, expansion can occur and building module types can be added to support a new customer on the same existing parcel of land or expand for a current customer. In general, the new expansion can then choose to try to share one or more of the previously fabricated and installed building module types 102-108 or build its own instance of that building module type.

The initial datacenter built in a parcel of land will include the set of four building modules of different types of functionality: the data-floor building module 104; the hardened-structure building module 106; the office-support building module 102; and the power center building module 108. The hardened-structure building module 106 houses the building integrity structure of the truly modular datacenter.

These four building modules make up the truly modular datacenter facility and it is approximately 20,680 square feet. The Truly Modular Datacenter consists of the above four (4) modules connected together, working in unison. This module synergy provides a unique facility layout that results in a highly efficient datacenter.

Each building module type in the set of building modules of different types of functionality is architected and formed as a totally separated building that is interconnected to another building module via the connecting corridor that 1) wraps around a data floor containing the servers and storage devices housed in hot and cool zones in a data-floor building module 104 and 2) interconnects to a power center building module and an office-support building module 102 via the aligned doors between these building modules.

The modular datacenter facility is illustrative only of an exemplary environment for the disclosed air dam for datacenters. Embodiments as described herein may be used in any datacenter environment to evenly distribute air to a datacenter room. For example, an air dam may be incorporated into any datacenter in which air is circulated using an under floor delivery system. This configuration typically uses a raised floor in which air is directed from panels of the floor. An air source may deliver the air to the floor panels from units positioned within or under the floor directly or directed from an external air source. The external air source may be positioned above, for example on a roof or ceiling, or below, for example in a basement or lower floor, the room of the datacenter, or may be within or through the walls of the datacenter. Alternatively or additionally, the air dam may be incorporated into a ceiling delivery unit that is operated similar to the under floor delivery system, but uses ceiling paneling, for example through a dropped ceiling, instead of the floor paneling. Either or both embodiments may be incorporated to take advantage of the natural currents induced by air temperature differentials, i.e. warm air rising over cool air.

Figure 2A:
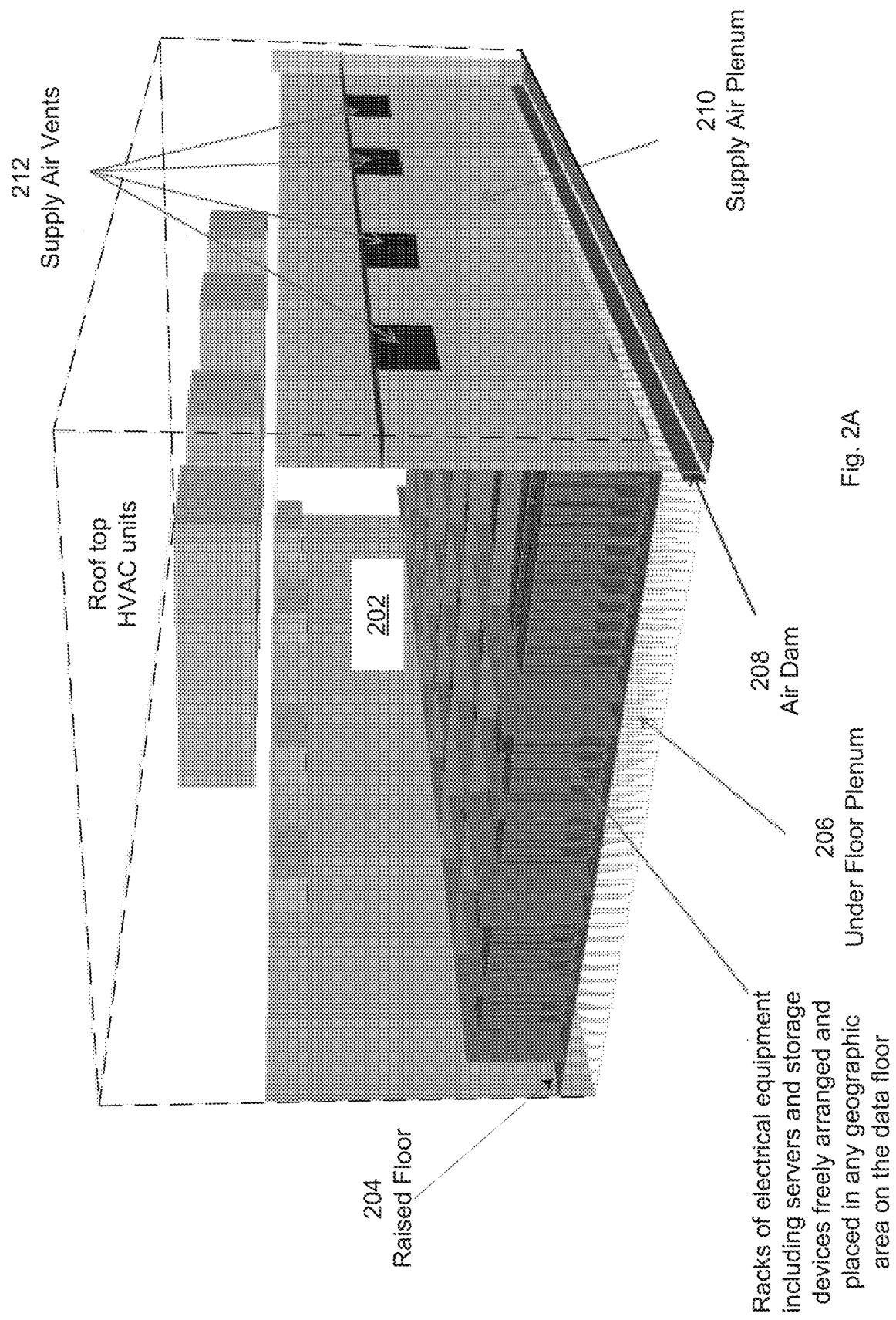
FIGS. 2A and 2B illustrate an exemplary datacenter facility incorporating an exemplary air dam.
Figure 2B:
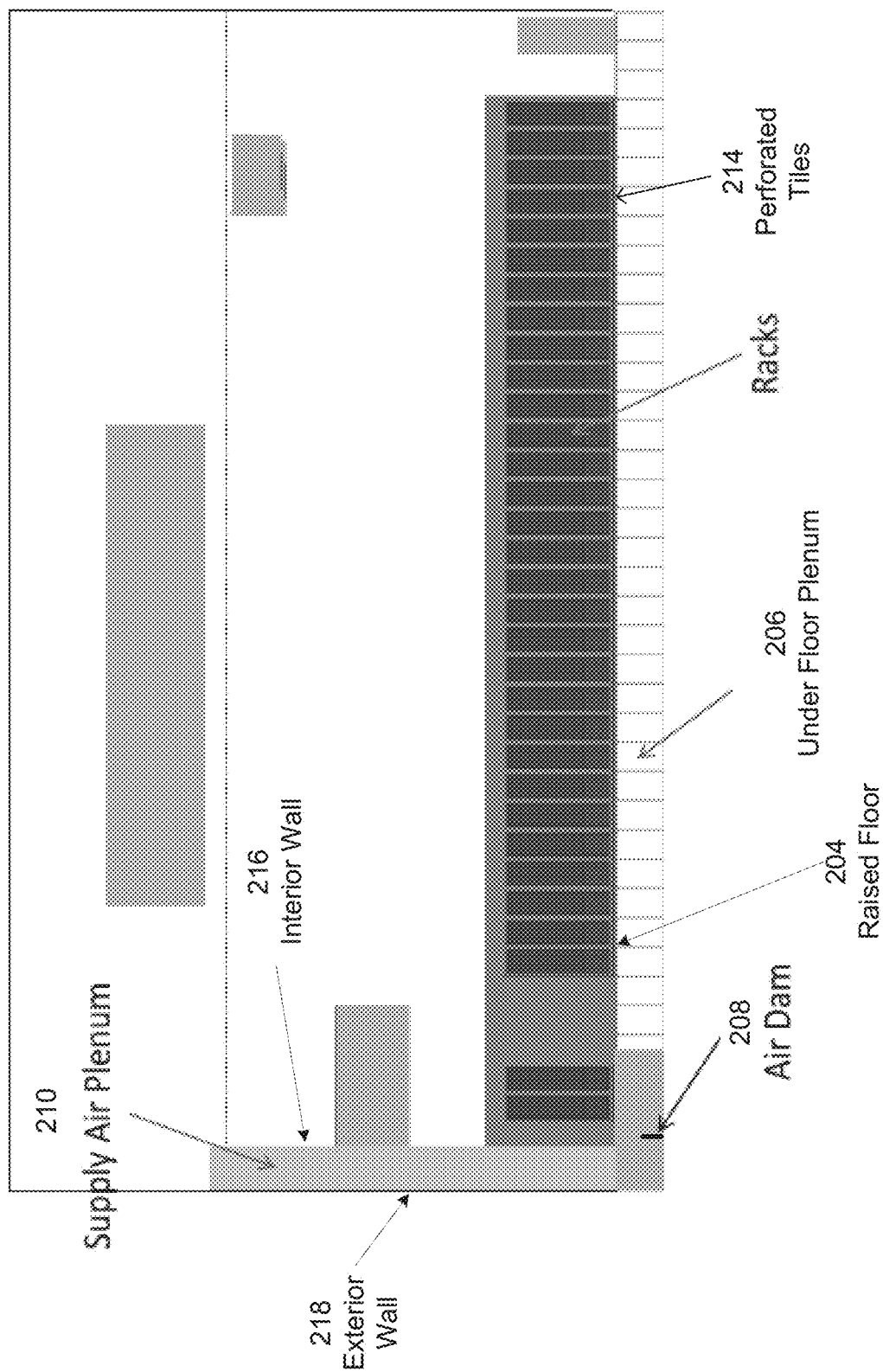

FIGS. 2A and 2B illustrate an exemplary datacenter facility incorporating an exemplary air dam. FIG. 2A is a cut away perspective view of the interior of the data room, under floor plenum, and supply air plenum, while FIG. 2B is a two-dimensional front view of the cut-away perspective of FIG. 2A.

The data room 202 includes an interior space for positioning racks of electrical equipment including servers and storage devices. The data room 202 may accommodate any arrangement of electrical equipment, fully utilizing and/or maximizing the entire available floor space. Although not necessary, the data room 202 is an open cavity without supporting columns or air obstructions other than the electrical equipment and support structures associated with the electrical equipment. The data room 202 may be partitioned into sub-spaces by separating structures enclosing one or more electrical equipment providing sub-sections assignable to different persons, organizations, security levels, data usages, etc. The separating structures may be elevated to a height above the electrical equipment to enclose the electrical equipment along vertical sides of the equipment. In an exemplary embodiment, the separating structures are open along a top area of the electrical equipment, and thus do not impede air flow of the upper portion of the data room. As such, the data room 202 may include an area proximate the ceiling that is generally unobstructed through a central portion of the area. The separating structures, for example, may extend to a height of ¾ of the room height or less, such as approximately ½ of the room height.

Air is delivered to the data room 202 through a raised floor 204 creating an under floor plenum 206. Air may be delivered from HAVC units housed on a roof top of the datacenter and directed through supply air vents 212 in the ceiling of the data room 202, through a supply air plenum 210 along one wall of the data room 202, through the under floor plenum 206, and through the raised floor 204. The supply air plenum 210 may comprise an open section within at least one wall of the data room 202. The supply air plenum 210 may extend along a majority, a substantial portion, or the entire length of one or more walls. The supply air plenum is between an interior wall 216, extending between the ceiling of the data room 202 and the raised floor 204, and an exterior wall 218 and provides access to the under floor plenum, between the raised floor 204 and the floor. The raised floor 204 may be composed of perforated tiles 214 to permit the air to enter the data room 202 from the under floor plenum.

An air dam 208 may be incorporated along an edge of the under floor plenum 206. For example, an air dam 208 may be positioned between the supply air plenum 210 and the under floor plenum 206. The air dam 208 is an obstruction in the air flow between the supply air plenum 210 and the under floor plenum 206. The air dam 208 may be any general shape to obstruct the air flow as it transitions directions from generally vertically along the wall to generally horizontally along the floor. For example, the air dam may be a planar surface of generally equal thickness along the projection, such that the projection is generally rectangular in cross section. The thickness of planar surface may also be tapered or reverse tapered toward the upper edge, such that the planar surface is thicker or thinner along a bottom portion of the surface than toward a top edge of the surface, such that the surfaces creates a generally triangular or trapezoidal cross section. The taper may also be non-linear such that the surface is non-planar, concave or convex toward the incoming air stream. In an exemplary embodiment, the air dam 208 is a planar or generally planar projection from the floor toward the raised floor perpendicularly oriented from the floor at approximately half of the height between the floor to the underside of the raised floor.

The air dam 208 is positioned at an entry region of the under floor air supply plenum 206 to obstruct the flow of incoming ventilation air into the under floor air supply plenum 206 to cause a constant airflow through perforated tiles mounted on the raised floor. The placement of the computing equipment, including servers and storage devices, is allowed to be freely placed in any geographical area in the data room rather than having to set up the computing equipment in prescribed hot and cold zones.

Figure 3:
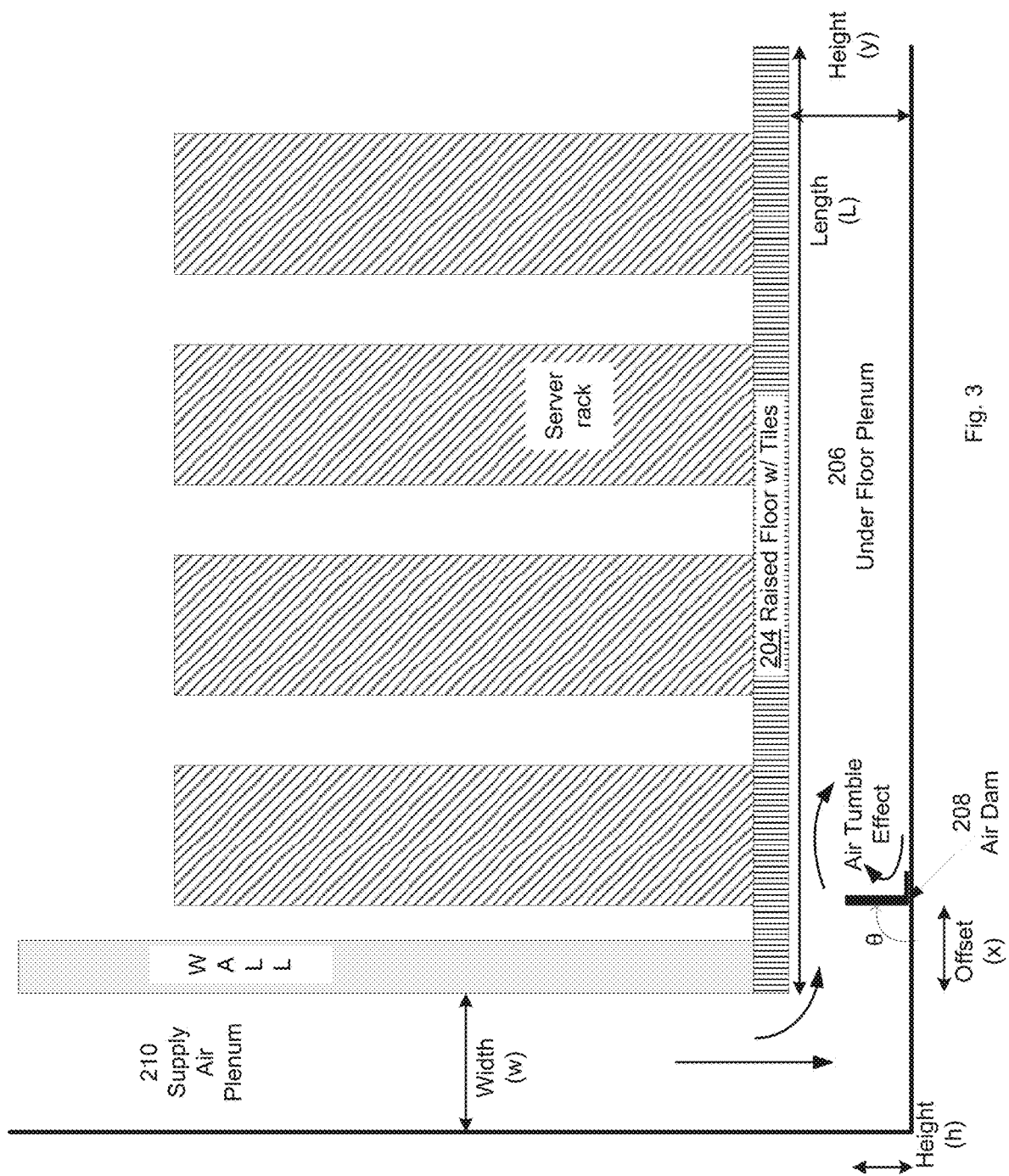
FIG. 3 illustrates an exemplary geometry of an exemplary air dam configured with respect to the data room, raised floor, and supply air plenums.

FIG. 3 illustrates an exemplary geometry of an exemplary air dam 208 configured with respect to the supply air plenum 210 along the full width of one vertical wall of the data room 202 transitioning to an under floor plenum 206 between a perforated floor and an actual floor along the bottom of the entire data room 202. The exemplary air plenum 210 has a width (w) from the exterior wall 218 to the interior wall 216, while the exemplary raised floor is raised by a height (y). The raised floor 204 has a length (L) from the interior wall 216 to an opposing wall of the data room 202. Exemplary dimensions include a supply air plenum width (w) and a raised floor height (y) of between 12 to 48 inches, preferably between 30 to 42 inches, and more preferably approximately 36 inches. These dimensions are not necessarily the same, but can be.

In an exemplary embodiment, the air dam 208 is an angled bracket that includes two planar sides generally angled from each other. The first side secures the dam to the actual floor and is positioned parallel to the floor along one surface, while the second side projects from the floor at an angle θ into the under floor space. The air dam 208 may be angled from the floor from between 45-135 degrees and more generally between 45-90 degrees. The angle of the air dam preferably positions the top edge of the air dam equal or closer to the exterior wall 218 than a bottom portion of the air dam that projects into the under floor space (i.e. less than or equal to 90 degrees when measured from the exterior side of the air dam).

The top edge of the air dam projects into the under floor space of the under floor plenum 206. The air dam 208 creates a barrier or obstacle to the air flow as it transitions from the supply air plenum 210 to the under floor plenum 206. The air dam is positioned to obstruct the air flow and generally reduce the velocity of the air flow entering the under floor plenum 206. Accordingly, the top edge of the air dam is positioned between 25% to 75%, and preferably between 40% to 60% and more preferably about 50% of the height of the under floor plenum 206 from the actual floor toward the raised floor. Therefore, an air passage is created over the top of the air dam 208 between the air dam and the raised floor 204. The air dam has a maximum height (h) measured from the actual floor toward the raised floor. The air dam 208 height (h) may be approximately 12-24 inches, preferably 16 to 20 inches, and more preferably 18 inches.

The air dam 208 may be positioned at an offset from the exterior side of the interior wall 216 toward the under floor plenum 206, i.e. toward the interior of the data room 202 or away from an exterior wall 218. In an exemplary embodiment, the air dam 208 may be offset from the exterior side of the interior wall 216 by 0-5% of the length of raised floor length (L), and more specifically from 0.5 to 1.5% of the length of the raised floor. Alternatively, the air dam 208 may be offset from the exterior side of the interior wall 206 by a distance equal to or less than the width (w) of the supply air plenum 210 and/or the height (y) of the under floor plenum 206. Preferably, the air dam 208 is offset (x) by approximately ¼ to ½ of the air plenum width (w) and/or air plenum height (y). In an exemplary embodiment, the air dam 208 may be offset from the exterior side of the interior wall 216 by 0 to 24 inches, 6 to 18 inches, or preferably 10 to 14 inches.

In an exemplary embodiment, the air dam may be actuated, such that the incident angle may be changed dynamically. For example, the air dam may include a hinged section controlled by a louver system, such that an anchor portion may be positioned and secured against the floor. An obstruction portion may extend upward into the under floor space, creating the obstruction to the incoming air. The obstruction portion may be hinged to the anchor portion, such that a variable angle may be achieved between the anchor portion and the obstruction portion. The air dam may then incorporate an actuator or controller to change the angle of the anchor portion with respect to the obstruction portion. Embodiments may also include an obstruction portion variably positioned with respect to the floor without the anchoring portion or with a different configuration of the anchoring portion. The controller and/or actuator may be used to orient the obstruction portion to a desired angle after installation of the air dam into the data center. The controller and/or actuator may be used at a time after installation to reconfigure the orientation of the obstruction. The orientation may be changed, for example, if the supply air source is changed, such that a different amount or pressure is supplied to the data room. The air dam orientation and relative height can be altered to optimize its configuration based on changes made to the room or components, including substituting or exchanging components, adding or reducing components, reconfiguring equipment layouts, changing perforated tiles, tile configurations, or altering the raised floor height. The actuation may be manual, such as moving a hinge through a racketing locking system, or automatic such that the air dam may include an automated controller to transition the dam to a desired inputted orientation. The actuation may be mechanical, such as a hinge, ratcheting hinge, locking hinge, or pneumatic, etc. The orientation and position of the air dam may also be controlled in other ways besides orienting an angle of a surface of the dam. For example, an obstruction portion may be hinged, telescoping, piecewise/modularly attachable, or otherwise extendible such that a vertical height may be altered without changing the incidence to the incoming air stream.

In an exemplary embodiment, the air dam may be configured to permit easily configurable orientations, such that the incident angle and relative height can be easily manipulated during installation of a single air dam. Accordingly, a single designed air dam may be incorporated into multiple data center facilities regardless of raised floor height, room dimensions, etc. The configurable dam may include a lock such that once the dam is oriented and positioned as desired, the position is locked, such that the orientation does not change during use. The lock may be permanent, or may be releasable, such that the air dam may be reconfigured upon changing one or more components and/or configurations of the data center. The air dam may also be sectioned such that different portions may be actuated or orientated based on the desired design parameters of the room.

The air dam may be made of one or more plastic, metal, carbon, polymer, composites or combinations thereof. The air dam should be sufficiently rigid to maintain is shape and orientation against the force and pressure of the incoming air stream.

FIG. 4 illustrates an exemplary air flow and corresponding gross pressure regions of the source air through the supply air plenum 210, past the air dam, and into the under floor plenum 206. The density of dots generally corresponds to the relative pressure distributions of the disclosed regions. The pressure zones are illustrative only, as the distribution of pressure between each region generally transitions more smoothly than shown, and outside of the under floor plenum may be more variable depending on the air patterns.

As shown air enters the supply air plenum 210 at a first pressure and velocity and generally travels evenly and generally vertically down the supply air plenum 210. Once the air reaches the bottom of the plenum, the air transitions directions toward the under floor plenum 206. The air essentially backs up against the air dam 208, the floor, and the exterior wall, creating a localized region of higher pressure. The air then flows over the top of the air dam 208 and creates an air tumble effect immediately adjacent the air dam 208 on the under floor side of the air dam, away from the exterior wall. The air generally circulates in the region of the air tumble effect such that a generally higher positive pressure is maintained at or near the raised floor, while a reduced or variable pressure may be detected adjacent the dam and near the floor. Outside of the air tumble effect region and across a majority or substantial portion of the raised floor, the pressure in the under floor plenum 206 is generally maintained at a constant pressure. The pressure, for example, may vary across this region outside of the air tumble region by 0.01 inches water or less, and more preferably by 0.005 inches water or less.

The air dam 208 is configured and positioned to create a generally even distribution of pressure in the under floor plenum across the entirety of the raised floor. Alternatively, embodiments as described herein may be used to control the pressure distribution across a majority of or substantial portion of the raised floor. For example, the pressure distribution at the raised floor on the under floor plenum side of the air dam may be controlled for generally constant pressure. Accordingly, approximately 90-100%, and preferably 95-100% of the floor length experiences constant pressure distribution of the injected air. The portion of generally constant pressure may be measured across the entire raised floor. Generally, even distribution of pressure is understood to be a pressure distribution more homogeneous than that achieved without an air dam. For example, the desired pressure distribution across the raised floor is maintained at or above 0.04 inches of water, and preferably between 0.04 to 0.07 and more preferably between 0.05 and 0.06. Accordingly, the pressure distribution across the raised floor may vary in exemplary embodiments by 0.04 inches of water, and more preferably by 0.02 inches of water across the entire raised floor. The pressure distribution across a majority of substantial portion of the raised floor may vary by 0.01 inches of water or less and more preferably by 0.05 inches of water. Embodiments as described herein may achieve a positive pressure distribution across the entire raise floor with a pressure variation of less than 25% of an average pressure across the raised floor, and more preferably of less than 20%, 10%, or 5%.

It is also desired to maintain a positive pressure across the entire floor such that the cool air supplied from the supply air source is distributed over and into the entire floor space. Pockets of negative pressure may arise in conventional under floor systems. Negative pressure at the raised floor may actually draw heated air from the data room into the supply air plenum, thereby pre-maturely heating the incoming air. In traditional systems, negative pressures may be detected at the entry into the under floor plenum 206 from the supply air plenum 210, of between −0.01 to −0.022 inches water. Positive and negative pressure is used to indicate the relative pressure of the air at the raised floor, such that a positive pressure creates a pressure force into the data room, while a negative pressure creates a pressure force out of the data room.

Embodiments as described herein may achieve more efficient distribution of air into the data room. For the same amount of energy to supply an incoming air source at a given velocity and/or pressure, the pressure achieved within the data room without the air dam is substantially reduced. For example, for the same source velocity and pressure, the air pressure across the raised floor may be improved by 2-3 times. Thus, pressures of only 0.02 to 0.03 inches water may be achieved with contemporary systems without an air dam, while pressures of 0.06 to 0.07 inches water may be achieved with the same source supply conditions with a system incorporating embodiments described herein.

Figure 5A:
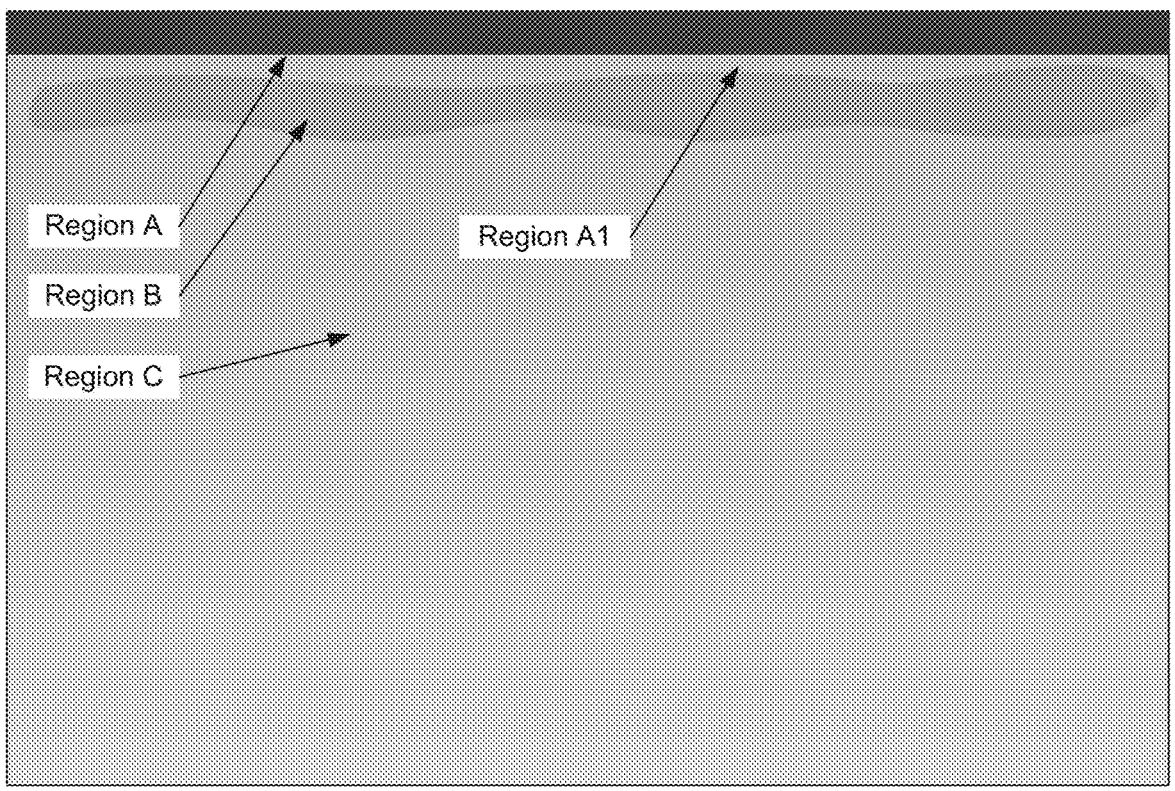
FIGS. 5A and 5B provide an illustrated gray scale pressure distribution taken at a horizontal cross section of the data room at the raised floor.
Figure 5B:
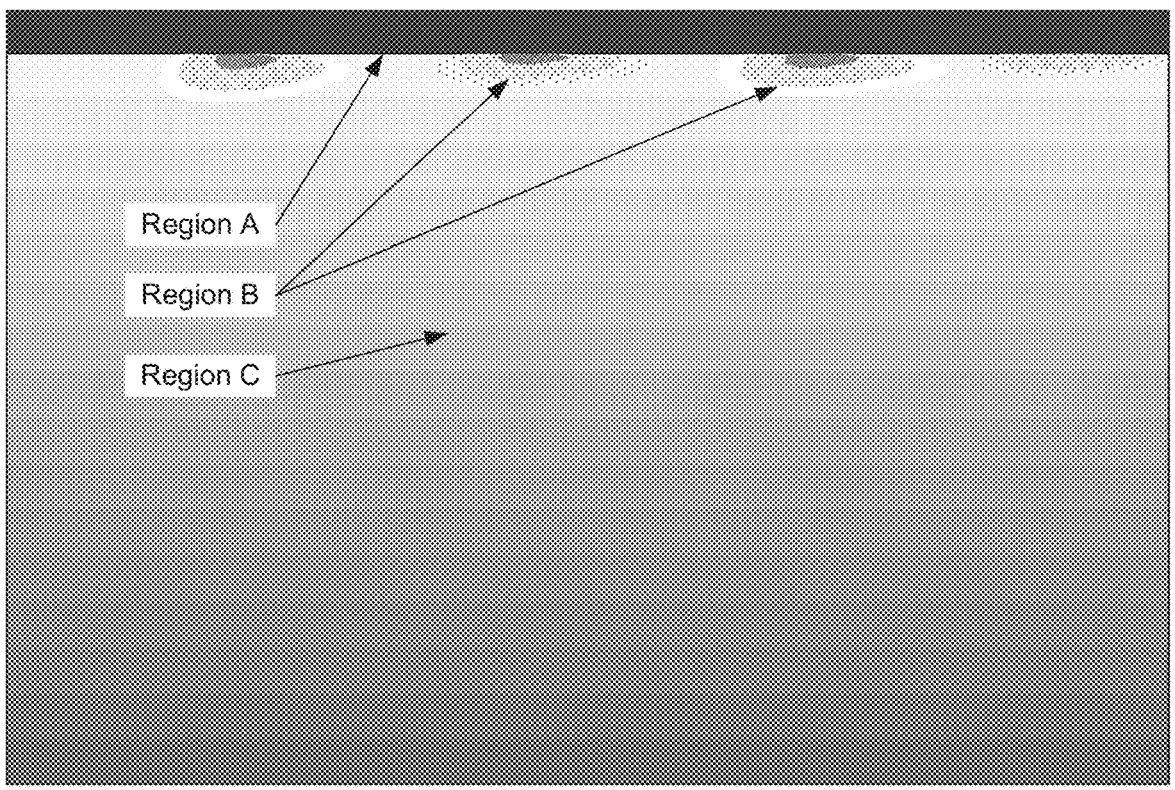

FIGS. 5A and 5B provide an illustrated gray scale pressure distribution taken at a horizontal cross section of the data room at the raised floor. The solid shading generally indicates a positive pressure while, with the higher pressures indicated by the darker shading. Dotted shading generally indicates negative pressure with the denser dots indicated lower pressures (greater negative pressures). FIG. 5A illustrates an exemplary pressure distribution for embodiments incorporating an air dam according to the present description. FIG. 5B illustrates an exemplary pressure distribution for conventional systems without an air dam.

In Region A, FIG. 5A illustrates a high pressure area in the supply air plenum 210 between the exterior wall 218 and the exterior side of the air dam 208. The corresponding Region A of FIG. 5B is contained within the supply air plenum space only. Exemplary pressures within Region A of FIG. 5A may be generally at or above 0.1 inches water, while the corresponding pressure in Region A of FIG. 5B is between 0.015 and 0.025 inches water. The increased pressure of FIG. 5A is created by the air dam backing up the incoming air stream into the under floor plenum 206. FIG. 5A then has a small Region A1 corresponding to the air passing over the top of the air dam.

In Region B, the air enters the under floor plenum. In the configuration of FIG. 5A, with the air dam, the air undergoes a tumbling effect as it cascades over the dam. The pressure immediately adjacent the air dam at the raised floor is therefore maintained at a positive pressure at or around that of the remaining raised floor (i.e., Region C described below). The pressure is likely at least 50% of the remaining raised floor pressure. The corresponding Region B of FIG. 5B, without the air dam, shows pockets and areas of negative pressure (indicated by the dotted areas). As the air hits the floor and changes directions from the vertical supply air plenum to the horizontal under floor plenum, the air can create gaps or voids at the raised floor immediately adjacent the interior wall. These gaps therefore create negative pressure areas such that air from within the data room may be drawn into the under floor plenum. The pressure associated with the air tumble effect, Region B, of FIG. 5A can be, for example, approximately 0.04 inches water, positive. The pressure of Region B of FIG. 5B can be −0.022 inches water (the interior dense dots of Region B) to −0.01 inches water (the less dense dots of Region B) and transition to the room pressure with 0.0015 inches water (the white areas of Region B).

Region C is the area of the raised floor, excluding the portions of Region B. With the air dam, the pressure distribution of Region C is fairly constant varying by less than 20% and preferably by less than 10%, and more preferably by less than 5%. As shown, the pressure of Region C is approximately 0.06+/0.01 inches water. The corresponding Region C of FIG. 5B varies along its length. The pressure is at a maximum on the side opposite the supply air plenum. Because of the velocity of the air entering the under floor plenum and the path around the interior wall, the air travels across the under floor plenum until it encounters the opposing wall. The opposing wall then slows the air. As the pressure builds, the air is redirected across the under floor plenum upward through the perforated floor. Therefore, the pressure is greatest opposite the supply air plenum and can reach pressures of approximately 0.02 inches water. The pressure is less toward the supply air plenum and is even negative at the Region B areas. The pressure can vary by at least 50% or more. For example, the maximum pressure of Region C of FIG. 5B at the opposing wall of the supply air plenum may reach 0.02 to 0.025 inches water, while the pressure adjacent the supply air plenum is around 0.0015, and reaches negative pressures of up to −0.022 inches water within the Region B transition.

Figure 6:
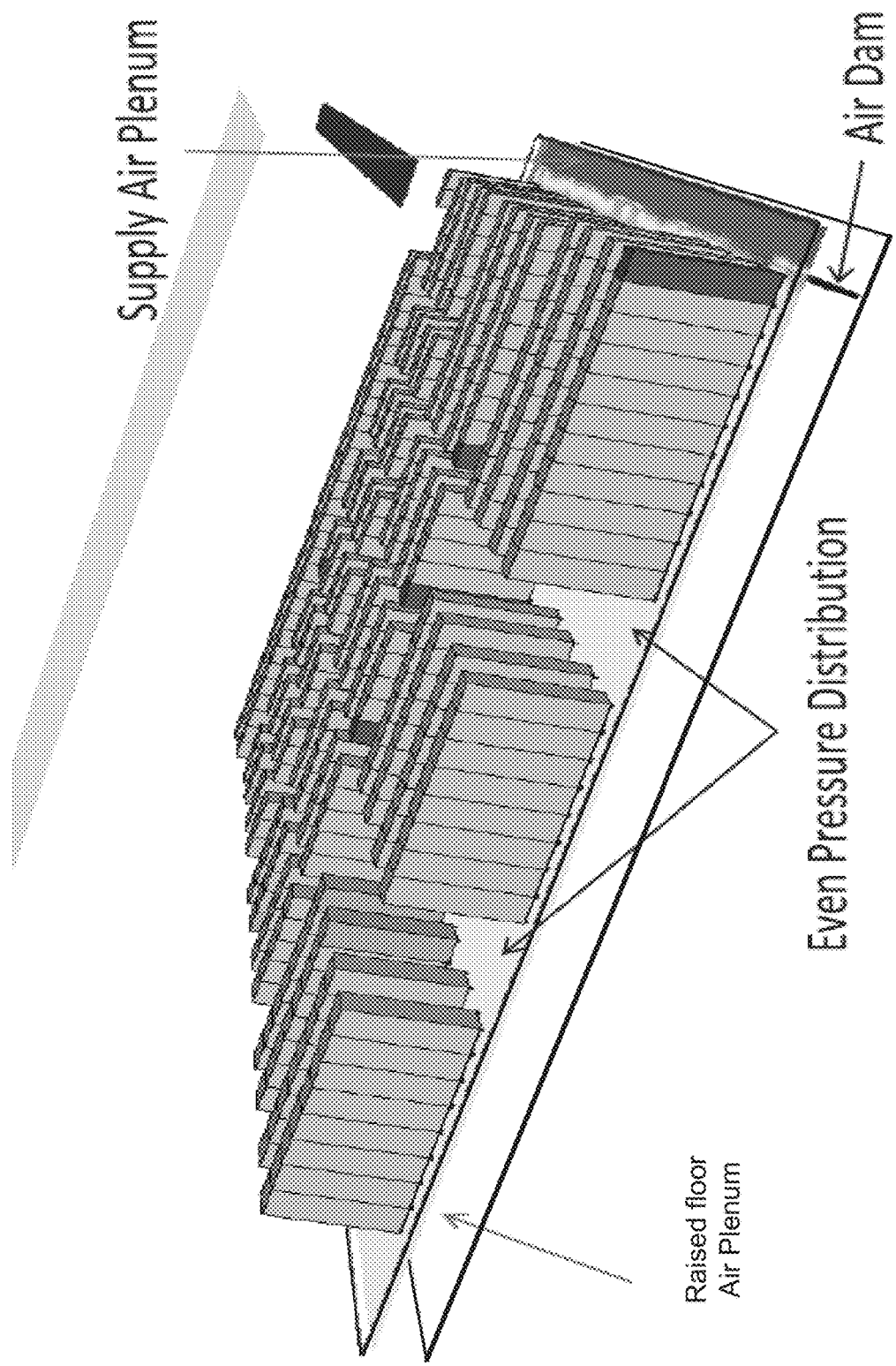
FIG. 6 illustrates the pressure distribution of the supply air through the raised floor in an exemplary data center including electrical equipment.

FIG. 6 illustrates the pressure distribution of the supply air through the raised floor in an exemplary data center including electrical equipment. As shown, the even pressure distribution across the entire data room raised floor permits the entire floor space to be utilized without concern for localized hot or cold areas. Accordingly, a lot more space efficiency may be achieved and a lot more freedom for equipment location may be realized.

Figure 7:
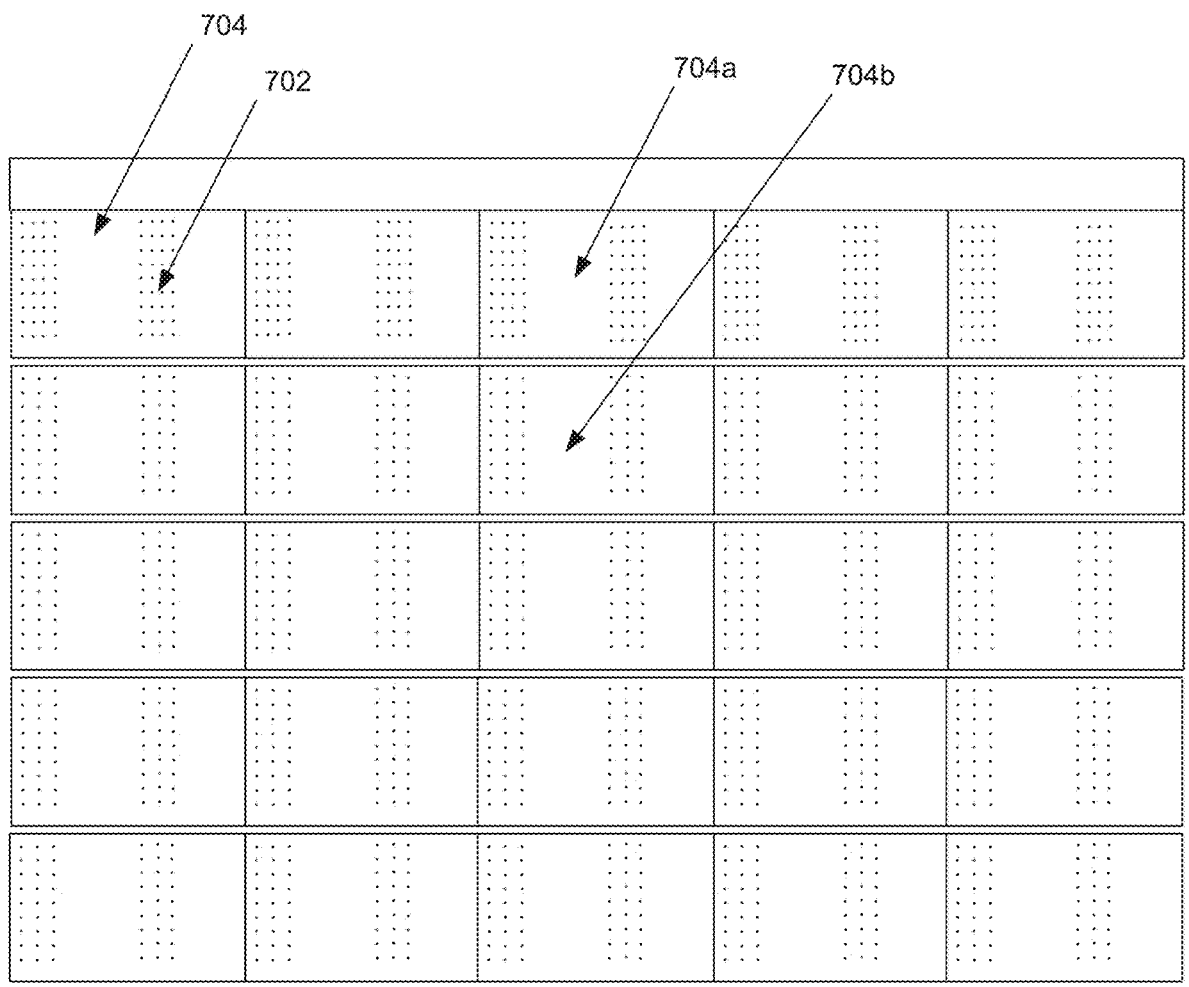
FIG. 7 illustrates exemplary raised floor panels including a plurality of perforations to permit the air to enter the data center from the under floor plenum.

FIG. 7 illustrates exemplary raised floor panels 704 including a plurality of perforations 702 to permit the air to enter the data center from the under floor plenum. The raised floor has a pattern of perforations 702 in tiles 704 laid out on a top surface of the raised floor in which a plurality of perforations 702 are consolidated to permit air to pass into the cold aisles of the computing equipment arranged in rows within an interior space of the datacenter. The patterns having a fewer amount of perforations 702 in areas correspond to hot aisles of the computing equipment. The floor panels 704 may be uniform across the data room raised floor, or may be tailored to a specific layout of electrical equipment within a data room. In an exemplary embodiment, the perforations 704 are configured to inject air into the data room, in which the electrical equipment is oriented in rows. The electrical equipment may be configured such that 'hot' and 'cold' aisles are created by the air inlet/outlet of the individual devices. The perforations may be positioned or may be more dense along the cold aisles, such that the cooling supply air is injected into the data room at the air let side of the electrical equipment. The supply air then traverses the electrical equipment, maintaining a desired temperature, and ejected into the hot aisle of the data room.

The floor panels may vary, for example 704a and 704b depending on the data room equipment layout. For example, the perforations may be used to compensate for the lower pressure imposed immediately adjacent the air dam. Because of the reduced pressure, additional perforations, or a denser concentration of perforations may be used to provide an even distribution of air into the data room. Therefore, the floor tiles, and the respective pattern, location, and density of perforations may be used to compensate for or reduce any variation in air circulation into the data room caused by the under floor pressure; electrical equipment location, configuration, and orientation; or air flow obstructions, such as for example, support columns within the data room.

The perforations may also be used to create and impose a desired variation in the injected air circulation. Because of the substantially even under floor pressure, the perforation pattern and density should directly correlate to the air injected into a room. Therefore, specific pressure measurements do not have to be taken before designing a perforation pattern to compensate for the pressure distribution to then impose the desired injected air pattern into a room. Instead, a desired pattern and amount of air distribution into a room can be configured and implemented through a direct correlation with the pattern and density distribution of perforations within the floor tiles.

The data room may also include a lowered ceiling designed to extract the hot air rising from the electrical equipment. The lowered ceiling may also include perforated tiles configured to withdraw air from the data room. The perforations, similar to the raised floor tiles, may be configured to achieve a desired extraction of air from the data room. Therefore, the perforations may be uniform across the data room, or may be designed depending on the data room electrical equipment layout. For example, the perforations may be similar to those of FIG. 7, but oriented above the 'hot' aisles such that the used air exiting the electrical equipment, and caring the extra heat of the electrical equipment may be immediately extracted from the room.

The air dam positioned at an entry region of the under floor air supply plenum is used to obstruct the flow of incoming ventilation air into the under floor air supply plenum. The air dam causes a constant airflow through perforated tiles mounted on the raised floor. A placement of the computing equipment, including servers and storage devices, is allowed to be freely placed in any geographical area in the data room rather than having to set up the computing equipment in prescribed hot and cold zones.

Figure 8:
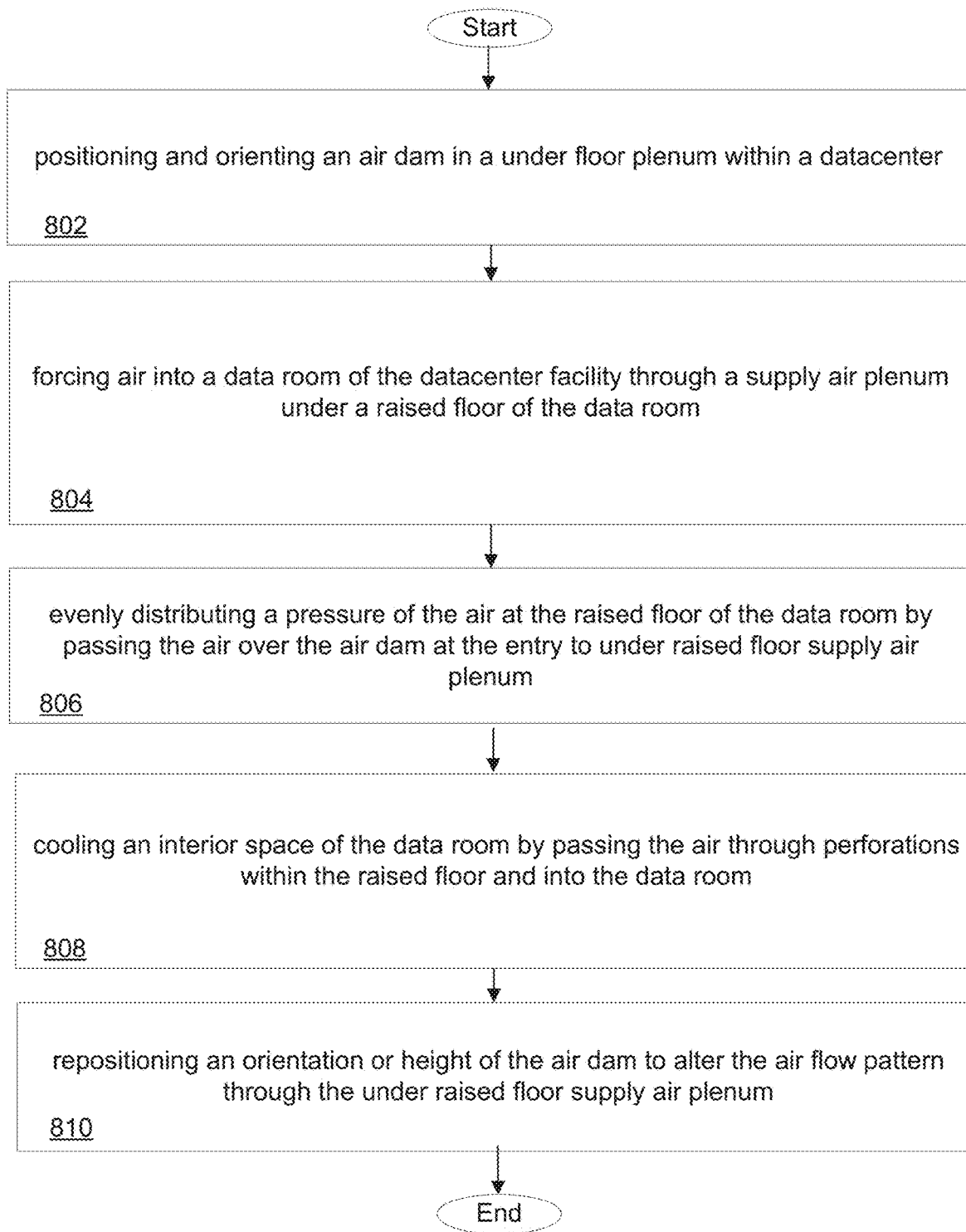
FIG. 8 illustrates an exemplary flow diagram of a method of cooling a data room using embodiments described herein.

FIG. 8 illustrates an exemplary flow diagram of an exemplary method of ventilating a datacenter facility. First, step 802, an air dam may be positioned and oriented within the under floor plenum within a datacenter. The positioning and orientation may include offsetting the air dam from an interior wall of the data room, actuating or orienting a hinged or dynamically positionable air dam to achieve a desired orientation, angle, and height, or securing or locking the position and orientation with respect to a floor of the datacenter. Step, 804, air may be forced into a data room of the datacenter facility through a supply air plenum under a raised floor of the data room. Step, 806, a pressure of the air at the raised floor may be evenly distributed across the data room by passing the air over an air dam at the entry to under raised floor supply air plenum. The air may be supplied to the interior space at a positive pressure distribution across the entire raise floor, and a pressure variation of less than 20% of an average pressure across the raised floor. At step 808, the interior space of the data room is maintained at a desired temperature or cooled by passing the air through perforations within the raised floor and into the data room. The perforations within the raised floor may be configured or positioned such that a desired air flow pattern is created within the interior of the datacenter.

The air may further be forced into a primary supply air plenum along a space within a vertical wall of the data room, where the primary supply air plenum is connected to the under raised floor supply air plenum and oriented perpendicular thereto. The air dam may then be positioned in a transition region between the primary supply air plenum and the under raised floor supply air plenum such that a positive relative pressure is maintained across all of the perforations in the raise floor. In particular, the air dam may be placed within the transition region under the raised floor such that the air dam is offset toward the interior of the datacenter from the vertical wall of the data room by less than half of a width of the primary supply air plenum within the vertical wall. The height of the air dam may be positioned such that the air dam is less than approximately three-quarters of a height of the raised floor supply air plenum. The offset and height may be determined or positioned to create a generally even positive pressure across the raised floor.

Finally, step 810, if any configuration or component of the datacenter is altered, or the performance of the datacenter ventilation is compromised or not optimized, the orientation or height of the air dam may be repositioned or altered such that the air flow pattern through the under raised floor supply air plenum may be controlled. If the air dam is locked, the air dam may be unlocked and moved to a new positioned by rotating, leveling, raising, lowering, etc. the projection of the air dam obstruction into the air plenum space. The air dam may be relocked to retain the air dam in a new desired position and/or orientation.

While some specific embodiments of the design have been shown, the design is not to be limited to these embodiments. For example, the air dam is shown and described as incorporated into an under floor air distribution system for use in datacenters. Other air distribution and injection systems may equally benefit from embodiments as described herein, including injection through perforated ceiling tiles, or directed ventilation using pipes or conduits. Other applications requiring even air circulation may also benefit of embodiments described herein, which are not only beneficial to datacenter applications. The design is to be understood as not limited by the specific embodiments described herein, but only by the scope of the appended claims. Moreover, specific components and various embodiments have been shown and described. It should be understood that the invention covers any combination, sub-combination, or re-combination, including duplicating components, subtracting components, combination components, integrating components, separating components, and/or dividing components.

The terms "approximately" and "about" are used interchangeably to indicate that the disclosed and suggested values do not require exact precision. The relative inclusions of values around each value depends on the error in building, manufacturing, and installing the components, as is generally practiced by a person of skill in the art. Even without the specific identification of approximation (i.e. the term "about" or "approximate"), all of the dimensions disclosed are exemplary only and include equivalent or approximate values to the stated value to achieve similar, equal, or better benefits or effects to those of the disclosed dimensions. "Majority" is understood to be more than 50% of the floor area, while "substantial" is understood to be at least more than 75% of the floor and preferably more than 85% of the floor area.

What is claimed is:

1. A method of ventilating a datacenter facility, comprising:
   forcing cooling air into a data room of the datacenter facility through a supply air plenum under a raised floor of the data room, where the data room houses computing systems in the datacenter facility, where the computing systems includes servers and storage devices arranged in hot and cool zones, and air flow of the cooling air cools the computing systems in the data room by passing the air through one or more perforated floor tiles or other open areas in the raised floor of the data room;
   customizing a distribution of the cooling air through the one or more perforated floor tiles or other open areas in the raised floor of the data room by placing one or more magnetic blocking tiles in a pattern to lay on top of the one or more of the perforated floor tiles or other open areas;
   cutting off the cooling air flow through the perforated floor tiles or other open areas to areas where the computing systems are not installed; and thus, directing the air flow to areas in the datacenter where the computing systems are designed to be located and actually are installed in the datacenter, where the magnetic blocking tiles have a top surface that is solid and a bottom surface, where the magnetic blocking tiles adhere magnetically to either the raised floor or the perforated floor tiles; and
   forcing the cooling air into a primary supply air plenum along a space within a vertical wall of the data room, wherein the primary supply air plenum is connected to the supply air plenum under the raised floor and oriented perpendicular thereto, and an air dam is positioned in a transition region between the primary supply air plenum and the supply air plenum under the raised floor such that a positive relative pressure is maintained across all of the perforations in the raise floor, and positioning a height of the air dam such that the air dam is less than approximately three-quarters of a height of the raised floor supply air plenum, with an offset and height positioned to create a generally even positive pressure across the raised floor.

2. The method of ventilating the datacenter facility of claim 1, further comprising:
   placing the magnetic blocking tiles in two or more distinct areas of one or more data rooms to allow data center operators to place the magnetic blocking tiles throughout the facility to manage air flow properly and increase an efficiency of the cooling of the computer systems in the datacenter facility.

3. The method of ventilating the datacenter facility of claim 1, further comprising:
   placing the magnetic blocking tiles in two or more distinct areas of one or more data rooms to allow a precision commissioning of a datacenter facility by allowing one or more data floors to be constructed with its full complement of the perforated floor tiles and openings for air flow to support a maximum designed capacity of computing systems in each data floor but then through use of the placement of the magnetic blocking tiles over the perforated floor tiles and openings where the computing systems are designed and planned to be located but currently are not installed, then this placement the magnetic blocking tiles allows the data center operators to refine the heat load being cooled by the HVAC systems of the data center to focus on cooling computing systems actually currently installed in the one or more data floors that are already constructed.

4. The method of ventilating the datacenter facility of claim 1, further comprising:
   evenly distributing a pressure of the air through the one or more perforated floor tiles or other open areas in the raised metal floor of the data room by passing the cooling air over the air dam positioned at an entry to the supply air plenum under the raised floor, where the air dam is configured to cooperate with the placement of the one or more magnetic blocking tiles in the pattern to lay on top of one or more of the perforated floor tiles or other open areas, wherein a placement of the computing systems is configured to be freely placed in any geographical area in the data room rather than having to set up the computing equipment in prescribed hot and cold zones.

5. A method of ventilating a datacenter facility, comprising:
   forcing cooling air into a data room of the datacenter facility through a supply air plenum under a raised floor of the data room, where the data room houses computing systems in the datacenter facility, where the computing systems includes servers and storage devices arranged in hot and cool zones, and air flow of the cooling air cools the computing systems in the data room by passing the air through one or more perforated floor tiles or other open areas in the raised floor of the data room;
   customizing a distribution of the cooling air through the one or more perforated floor tiles or other open areas in the raised floor of the data room by placing one or more magnetic blocking tiles in a pattern to lay on top of the one or more of the perforated floor tiles or other open areas;
   cutting off the cooling air flow through the perforated floor tiles or other open areas to areas where the computing systems are not installed; and thus, directing the air flow to areas in the datacenter where the computing systems are designed to be located and actually are installed in the datacenter, where the magnetic blocking tiles have a top surface that is solid and a bottom surface, where the magnetic blocking tiles adhere magnetically to either the raised floor or the perforated floor tiles;
   evenly distributing a pressure of the air through the one or more perforated floor tiles or other open areas in the raised metal floor of the data room by passing the cooling air over an air dam positioned at an entry to the supply air plenum under the raised floor, where the air dam is configured to cooperate with the placement of the one or more magnetic blocking tiles in the pattern to lay on top of one or more of the perforated floor tiles or other open areas, wherein a placement of the computing systems is configured to be freely placed in any geographical area in the data room rather than having to set up the computing equipment in prescribed hot and cold zones; and forcing the cooling air into a primary supply air plenum along a space within a vertical wall of the data room, wherein the primary supply air plenum is connected to the supply air plenum under the raised floor and oriented perpendicular thereto, and the air dam is positioned in a transition region between the primary supply air plenum and the supply air plenum under the raised floor such that a positive relative pressure is maintained across all of the perforations in the raise floor, and positioning a height of the air dam such that the air dam is less than approximately three-quarters of a height of the raised floor supply air plenum, with an offset and height positioned to create a generally even positive pressure across the raised floor.

6. An apparatus, comprising:

one or more magnetic blocking tiles that have an anti static rating of at least 10,000 ohms and are made of or coated with a dust-resistant material, where the one or more magnetic blocking tiles have a bendable but rigid structure to be placed on perforated floor tiles or open areas where air could flow in a datacenter to aid in controlling the air flow in the datacenter, where the datacenter houses computing systems, where the computing systems includes servers and storage devices arranged in hot and cool zones, where the magnetic blocking tiles are placed on perforated floor tiles or open areas where air could flow through the floor, where the magnetic blocking tiles are placed on these perforated floor tiles or these open areas, in an area where electronic equipment, including the computing systems, is designed and planned to be located but currently is not installed; and thus, the magnetic blocking tiles cut off the air flow to areas where the electronic equipment is designed and planned to be located but currently is not installed, where the magnetic blocking tiles cut off the air flow to areas where the electronic equipment is not installed; and thus, directs the air flow to areas in the datacenter where electronic equipment is designed to be located and actually is installed in the datacenter, where the magnetic blocking tiles have a top surface that is solid and a bottom surface, which provide the anti static rating of at least 10,000 ohms and are made of or are coated with the dust-resistant material, where the magnetic blocking tiles adhere magnetically to either the floor or the perforated floor tiles, where the magnetic blocking tiles have the coating that has an anti static rating of at least 10,000 ohm to prevent damage to any electronic circuit devices in the computing systems including the servers and the storage devices arranged in hot and cool zones, that cannot tolerate a sudden flow of static charge, where the magnetic blocking tiles are configured to cooperate with an air dam installed in the data center, and where i) a placement of the magnetic blocking tiles is configured to cooperate with ii) the perforated floor tiles or iii) the open areas where air could flow through the floor and iv) the air dam, which all combine to assist in regulating air flow to the computing systems including the servers and storage devices arranged in hot and cool zones in the data center.

7. The apparatus of claim 6, where the bottom surface of the magnetic blocking tiles consists of a magnetic backing strip used to adhere to a raised metal floor, where the raised metal floor is created with a ferrous metal material or has a coating put onto the raised floor that incorporates loose ferrous metal material.

8. The apparatus of claim 6, where the magnetic blocking tiles have a magnetic material incorporated into one of the layers of the magnetic blocking tiles and the magnetic material is used to adhere to either a metal floor or metal perforated floor tiles without an additional adhesive bonding agent being needed between the magnetic blocking tile and an underlay surface of the metal floor or metal perforated tile.

9. The apparatus of claim 6, where the magnetic blocking tiles have a magnetic material incorporated into one of the layers of the magnetic blocking tiles and the magnetic blocking tiles are configured for a magnetic action to be used to hold the magnetic blocking tile in place, and any of 1) a raised floor may be made of a ferrous metal, 2) the perforated floor tiles are made of a ferrous metal, and 3) a coating, on either of the perforated floor tiles or on the raised floor, incorporates loose ferrous metal material, where the open areas are either i) formed in the raised floor or ii) adjacent to the sides of the raised floor.

10. The apparatus of claim 6, where a first magnetic blocking tile has a magnetic flux, of less than 0.4 Tesla or 1500 Oersted, at which value it is safe to assume that the magnetic field will not harm or alter data bits stored in memory device, and where a thickness and top layer of the first magnetic blocking tile is configured and made of a material to be durable enough for carts carrying equipment, potentially including server racks, desks and even a mainframe, weighing up to 1500 pounds to roll over the first magnetic blocking tile without permanently deforming the first magnetic blocking tile.

11. The apparatus of claim 6, where a first magnetic blocking tile has a 20 to 100 mm thickness from the top surface to the bottom surface for both being 1) durable enough to support carts carrying equipment weights of up to 1500 pounds rolling over the tiles without permanently deforming the first magnetic blocking tile as well as 2) having enough cushion to give some relief to a fatiguing of a person standing on the tiles.

12. The apparatus of claim 6, where the top surface of a first magnetic blocking tile has a sufficient friction coefficient of equal to or greater than 0.30 dynamic coefficient of friction (DCOF) to be slip resistant and give some friction so a person does not easily slip, such as being made from material such as vinyl, durable, and have a coating that has an anti static rating of at least 10,000 ohm to a maximum of $10^{12}$ ohms to prevent damage to electronic circuit devices that cannot tolerate a sudden flow of static charge.

13. The apparatus of claim 6, where the magnetic blocking tiles are configured to cooperate with the air dam installed in the data center, where a supply air plenum connects to an under floor plenum to supply the cooling air to the under floor plenum, where the supply air plenum is positioned adjacent an interior wall; and the air dam is positioned at an entry region of the under floor plenum to obstruct a flow of cooling air from the supply air plenum in order to cause a constant airflow through the perforations in the perforated floor tiles for an entire area of datacenter housing the computer systems.

14. The apparatus of claim 13, wherein the air dam is a planar projection from a floor of the datacenter toward a raised floor and angled with respect to the floor, where the air dam traverses the under floor plenum from one side of the data center to an opposing side of the data center, and wherein a height of the air dam measured perpendicular from the floor is half the height of the raised floor.

* * * * *